United States Patent
Luk et al.

(10) Patent No.: US 7,116,594 B2
(45) Date of Patent: Oct. 3, 2006

(54) SENSE AMPLIFIER CIRCUITS AND HIGH SPEED LATCH CIRCUITS USING GATED DIODES

(75) Inventors: Wing K. Luk, Chappaqua, NY (US); Leland Chang, New York, NY (US); Robert H. Dennard, Croton on Hudson, NY (US); Robert Montoye, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/933,706

(22) Filed: Sep. 3, 2004

(65) Prior Publication Data

US 2006/0050581 A1   Mar. 9, 2006

(51) Int. Cl.
G11C 7/00 (2006.01)
G11C 7/02 (2006.01)
G01R 19/00 (2006.01)
H03F 3/60 (2006.01)

(52) U.S. Cl. .................. 365/205; 365/207; 327/51; 327/52; 327/57; 327/61

(58) Field of Classification Search .......... 327/52, 327/57, 61; 365/205, 207; 330/252, 287
See application file for complete search history.

(56) References Cited

U.S. PATENT DOCUMENTS

| | | | |
|---|---|---|---|
| 4,613,957 A | * | 9/1986 | Iwahashi ............... 365/189.05 |
| 4,866,307 A | * | 9/1989 | Ashmore, Jr. ............ 365/185.1 |
| 4,999,812 A | | 3/1991 | Amin |
| 5,734,275 A | * | 3/1998 | Ashmore, Jr. ................ 327/51 |
| 5,847,583 A | * | 12/1998 | Matsubara .................... 327/51 |
| 6,549,042 B1 | * | 4/2003 | Proebsting .................... 327/51 |
| 6,646,946 B1 | * | 11/2003 | Tomishima et al. .... 365/230.03 |
| 2004/0178829 A1 | * | 9/2004 | Wang et al. ................... 327/51 |

* cited by examiner

Primary Examiner—Amir Zarabian
Assistant Examiner—Ly Duy Pham
(74) Attorney, Agent, or Firm—Ryan, Mason & Lewis, LLP

(57) ABSTRACT

A sense amplifier circuit comprises (1) an isolation device comprising a control terminal and first and second terminals, the first terminal of the isolation device coupled to a signal line, (2) a gated diode comprising first and second terminals, the first terminal of the gated diode coupled to the second terminal of the isolation device, and the second terminal of the gated diode coupled to a set line; and (3) control circuitry coupled to the control terminal of the isolation device and adapted to control voltage on the control terminal of the isolation device in order to enable and disable the isolation device. A latch circuit further comprises a precharge device comprising a control terminal and first and second terminals, the first terminal of the precharge device coupled to a power supply voltage, and the second terminal of the precharge device coupled to the first terminal of the isolation device.

18 Claims, 24 Drawing Sheets

GATED DIODE AMPLIFIER REPRESENTATIVE CIRCUIT

GATED DIODE AMPLIFIER REPRESENTATIVE CIRCUIT

SENSING HIGH VOLTAGE (FOR DATA ONE)

SENSING LOW VOLTAGE (FOR DATA ZERO)

SENSING HIGH VOLTAGE
(FOR DATA ONE)

SENSING LOW VOLTAGE
(FOR DATA ZERO)

WITH HALO + EXTENSION

NO HALO
NO EXTENSION

SENSE AMPLIFIER CIRCUITS AND HIGH SPEED LATCH CIRCUITS USING GATED DIODES

CROSS REFERENCE TO RELATED APPLICATIONS

This application is related to an application, the disclosure of which is hereby incorporated by reference, by W. Luk and R. Dennard, entitled "Amplifiers Using Gated Diodes," U.S. patent Ser. No. 10/751,714, filed on Jan. 5, 2004, and assigned to International Business Machines, Inc.

FIELD OF THE INVENTION

The present invention relates to semiconductors and, more particularly, relates to semiconductor devices and circuits using the same for amplifying signals.

BACKGROUND OF THE INVENTION

In the design of integrated circuits, the ability to detect small changes in voltage or current allows for realization of both high performance and low power consumption. This is possible because information indicating state of a signal can be detected and passed to subsequent stages of a circuit without having to wait for the signal to swing through its entire range, resulting in circuits with faster speed and lower power. Such technology is commonly used in memory arrays, which allow for high-speed access of individual memory elements. This technology can also be used to improve performance and power consumption when driving long wires and large capacitive loads, as well as for interfacing low voltage logic with regular logic operating under full supply voltage (e.g., Vdd). The enabling circuit for this technology typically is a sense amplifier circuit, which converts a small signal change (from the output of a low voltage circuit or from a signal source) into a relatively large signal that can be interfaced with the rest of the circuit.

In conventional single-ended, small signal sense amplifier circuits such as "class A" sense amplifier circuits, there are a number of items that are very difficult to control: biasing of the operating point; stability of the reference voltage; biasing current; sensitivity to threshold voltage; and process and temperature variations. This is especially true for circuits using future technology, due to increasing high leakage current and low supply voltage as transistors are scaled smaller, making such circuits very sensitive to voltage, temperature and process variations. For conventional differential-sense circuits, due to the increasing statistical variation between adjacent transistors in future technology, the advantage of differential mode small signal sensing is diminishing.

Another widely used circuit is a latch circuit. Latch circuits are used to hold data and logic states in large-scale integrated circuits. In a pipelined architecture, synchronous data flow is governed by a reference clock signal, which controls individual latches and latch-based registers, which are circuit blocks that either hold data or allow it to pass into the next pipeline stage. This technology significantly increases data throughput, which allows for high performance logic and memory circuits. By combining sense amplifier circuits and latch functionality into a single circuit block, high bandwidth signal amplification can be achieved.

Existing circuit techniques involve feeding the output of a sense amplifier circuit into a latch, which incurs the delay of two separate stages, thus making it difficult to attain high speed operation. Thus, there is a need to provide improved sense amplifier circuits, including circuits latching data, for uses such as signal sensing.

SUMMARY OF THE INVENTION

The present invention provides sense amplifier and latch circuits using gated diodes. Illustratively, the present invention presents new classes of sense amplifier and latch circuits based on gated diodes. The sense amplifier and latch circuits disclosed herein can used digital control, can detect and amplify small signals, and can function properly and robustly under a wide range of operating conditions of supply voltage, temperature, and process variation.

In a first aspect of the invention, a sense amplifier circuit is disclosed that comprises an isolation device comprising a control terminal and first and second terminals, the first terminal of the isolation device coupled to a signal line. The sense amplifier circuit also comprises a gated diode comprising first and second terminals, the first terminal of the gated diode coupled to the second terminal of the isolation device, and the second terminal of the gated diode coupled to a set line. The sense amplifier circuit additionally comprises control circuitry coupled to the control terminal of the isolation device and adapted to control voltage on the control terminal of the isolation device in order to enable and disable the isolation device. The control circuitry is additionally coupled to the set line and adapted to control a voltage on the set line. The signal line is adapted to be coupled to an input signal, and the second terminal of the isolation device may be used to derive an output for the sense amplifier circuit.

The sense amplifier circuit may also comprise an output device comprising an input and an output, the input of the output device coupled to the first terminal of the gated diode and to the second terminal of the isolation device. The output of the output device is adapted to be the output of the sense amplifier circuit. The output device is further adapted to produce an output signal on the output of the sense amplifier circuit based on a voltage on the first terminal of the gated diode.

In a second aspect of the invention, a latch circuit is disclosed that comprises a pass device comprising a control terminal and first and second terminals, the first terminal of the pass device coupled to a signal line, the control terminal of the pass device coupled to a first clock line. A precharge device in the latch circuit comprises a control terminal and first and second terminals, the control terminal of the precharge device coupled to a second clock line, the first terminal of the precharge device coupled to a power supply voltage, and the second terminal of the precharge device coupled to the first terminal of the pass device. The latch circuit further comprises a gated diode comprising first and second terminals, the first terminal of the gated diode coupled to the second terminal of the pass device, and the second terminal of the gated diode coupled to a third clock line. An output device, as part of the latch circuit, comprise an input and an output, the input of the output device coupled to the first terminal of the gated diode and to the second terminal of the pass device, the output of the output device adapted to be the output of the latch circuit, the output device adapted to produce an output signal on the output of the sense amplifier circuit based on a voltage on the first terminal of the gated diode. The signal line is adapted to be coupled to an input signal.

A more complete understanding of the present invention, as well as further features and advantages of the present invention, will be obtained by reference to the following detailed description and drawings.

BRIEF DESCRIPTION OF THE DRAWINGS

FIG. 5C shows an exemplary representative circuit for the gated diode amplifier of FIG. 5A when the gated diode is turned ON;

DETAILED DESCRIPTION OF PREFERRED EMBODIMENTS

The present invention provides improved sense amplifier circuits and improved latch circuits. For ease of reference, the following disclosure is separated into an Introduction section, a Sense Amplifier Circuits Using Gated Diodes section, a Sense Amplifier Latch Circuits section and an Improved Gated Diode Structure for Low Vt, Low Vt Fluctuation and Low Parasitic Capacitance section.

Introduction

A patent application by inventors W. Luk and R. Dennard, entitled "Amplifiers Using Gated Diodes," U.S. patent Ser. No. 10/751,714, filed on Jan. 5, 2004, the disclosure of which is hereby incorporated by reference, discloses amplifier circuits using gated diodes. The present "Introduction" section presents information related to using gated diodes in amplifier circuits. Additional information is presented in the "Amplifiers Using Gated Diodes" patent application.

The term "gated diode" as used herein refers to a two terminal semiconductor device comprised of a source (one terminal) and a gate (another terminal), where a relatively large amount of charge is stored in an inversion layer when the gate to source voltage (Vgs) is above (for an n-type gated diode) a threshold voltage, and substantially small amount, orders of magnitude smaller, or no charge is stored otherwise. As a result, the equivalent capacitance of the two terminal semiconductor device is nonlinear, meaning that the two terminal semiconductor device has a large capacitance when the voltage on the first terminal relative to the second terminal is above the threshold voltage and has a very small capacitance when the voltage on the first terminal relative to the second terminal is below the threshold voltage. A gated diode is an example of a two terminal semiconductor device. Any two terminal semiconductor device may be used comprising the property that the two terminal semiconductor device has a large capacitance when a voltage on the first terminal relative to the second terminal is larger than a predetermined voltage by typically a slight amount, and a substantially small capacitance, orders of magnitude smaller, when the voltage on the first terminal relative to the second terminal is less than the predetermined voltage. The predetermined voltage is called a threshold voltage herein. For instance, for a gated diode created using n-type Field Effect Transistor (FET) technology, voltages above a threshold voltage cause a large amount of charge to be stored in an inversion layer and voltages below the threshold voltage cause a substantially smaller amount of charge, orders of magnitude smaller, or no charge to be stored.

Figure 1A:
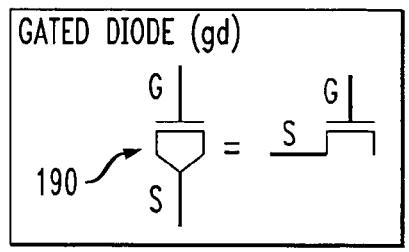
FIG. 1A shows exemplary symbols used for a first n-type gated diode.
Figure 1B:
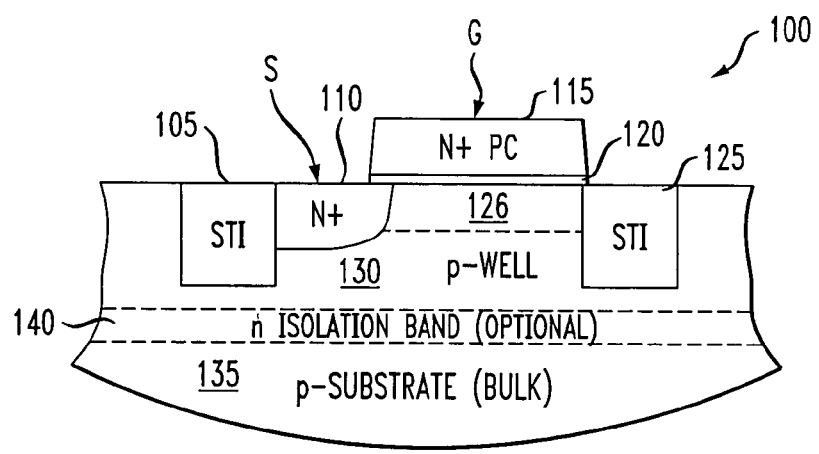
FIG. 1B shows an example of a side view of the first n-type gated diode formed in a semiconductor.
Figure 1C:
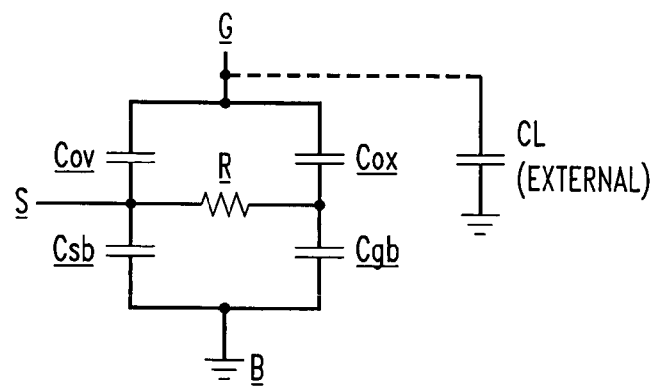
FIG. 1C shows an exemplary representative circuit used for modeling the first n-type gated diode shown in FIG. 1B.
Figure 1D:
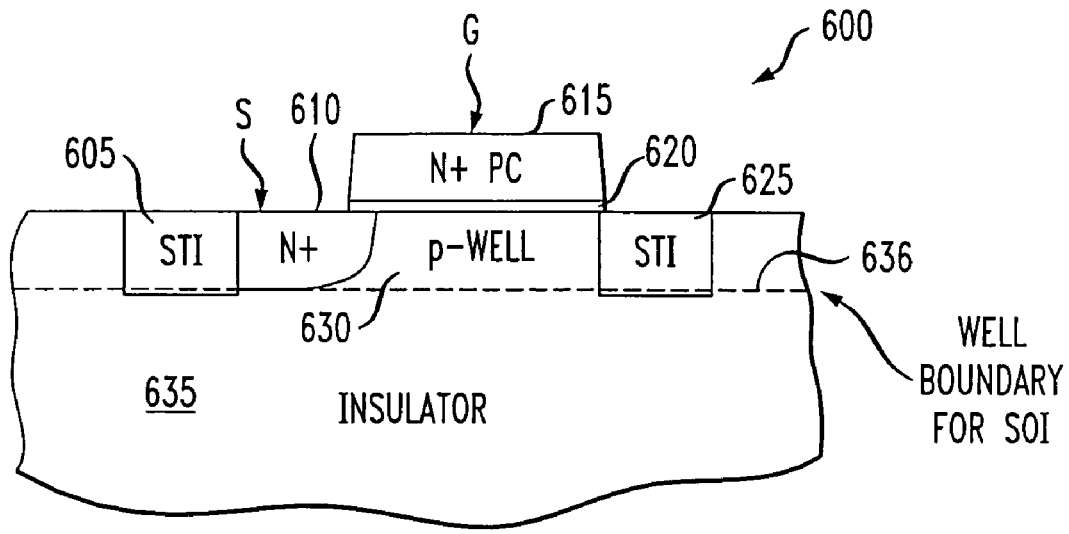
FIG. 1D shows an example of a side view of the first n-type gated diode formed in Silicon-On-Insulator (SOI)
Figure 2A:
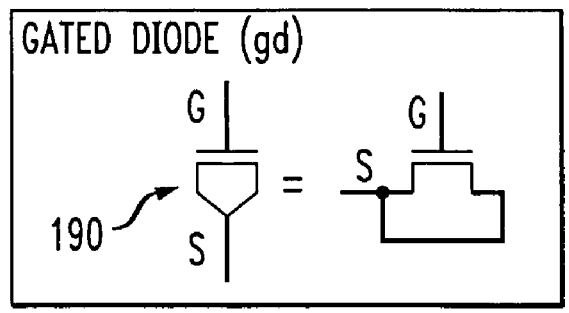
FIG. 2A shows exemplary symbols used for a second n-type gated diode.
Figure 2B:
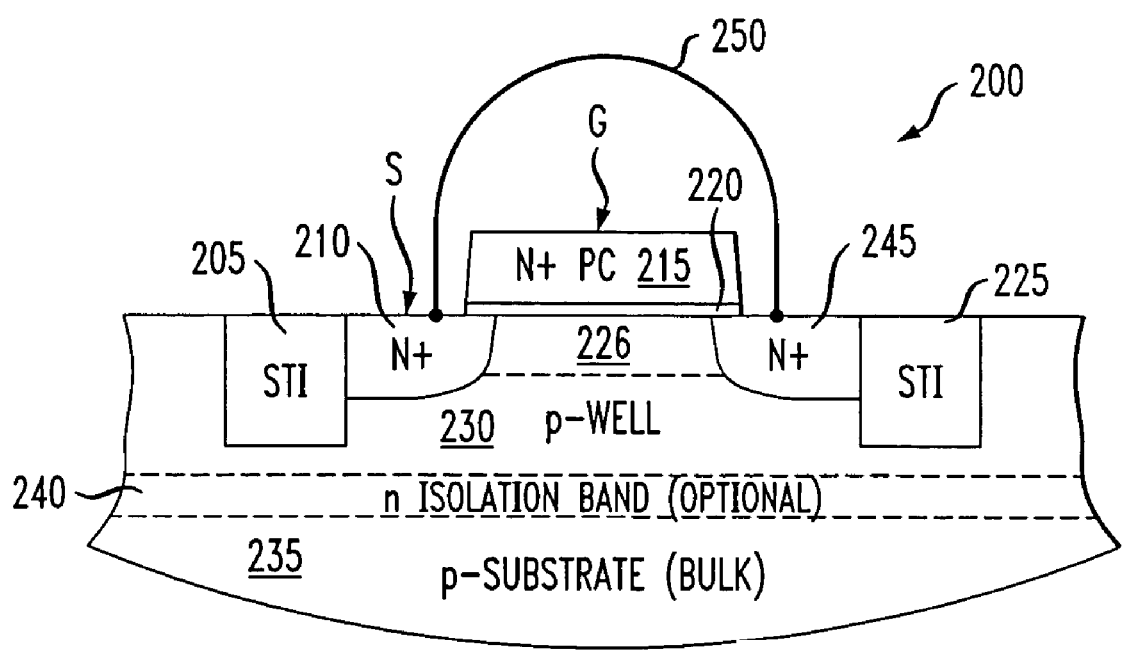
FIG. 2B shows an example of a side view of the second n-type gated diode formed in a semiconductor.

As shown in the following figures, in a conventional FET setting, a gated diode can be formed by the source and the gate of a three terminal FET device (either n-type or p-type), with the drain floating (e.g., disconnected or nonexistent), as shown in FIGS. 1A, 1B, and 1D. Sometimes the source and drain of such a FET can be connected together at the same potential and may be viewed as two gated diodes connected in parallel, as shown in FIGS. 2A and 2B. In this disclosure, these two situations are used interchangeably. And without specifying explicitly, a gated diode is referred to as just the first basic form, only a source and a gate of a semiconductor device.

FIG. 1A shows exemplary symbols used for a first n-type gated diode. Symbol 190 is an exemplary symbol for a first n-type gated diode shown in FIGS. 1A and 1B. FIG. 1B shows an example of a side view cross-section of the first n-type gated diode 100 formed in a semiconductor. The first n-type gated diode 100 comprises a gate insulator 120 formed between a gate 115 (e.g., N+ doped polysilicon) and a p-well 130, a source diffusion region 110, two Shallow Trench Isolation (STI) regions 105 and 125, an optional n isolation band 140, and a p-substrate 135. As described below, the dopant concentration in p-well 130 substantially controls the threshold voltage of the gated diode 100. An inversion layer 126 is formed when the threshold voltage, Vt, is reached on the gate to source voltage, Vgs.

In FIG. 1B, capacitance components exist between the gate 115, source 110, body (e.g., the volume of the p-well 130 under the gate 115 and between the source 110 and the STI region 125), and substrate 135. For example, four capacitances may be derived. These capacitances are called Cg_gd(ON), Cg_gd(OFF) for the gated diode, and CL(ON), CL(OFF) for the load. Although additional capacitance components may be used during modeling, the Cg_gd(ON), Cg_gd(OFF), CL(ON), and CL(OFF) capacitances are considered to be sufficient for modeling amplification by a gated diode. The ON and OFF gated diode capacitances, Cg_gd (ON) and Cg_gd(OFF), respectively, in terms of internal capacitances are shown in FIG. 1C.

FIG. 1C shows an exemplary equivalent circuit used for modeling the first n-type gated diode shown in FIG. 1B. In FIG. 1C (with appropriate reference to FIG. 1B), "R" is a resistance representing the ON/OFF inversion channel of the gated diode, Cov is an overlap capacitance from the gate 115 to the source 110, Csb is capacitance from the source 110 to the body substrate which is typically grounded for bulk silicon, Cox is the capacitance of the gate insulator 120 (typically an oxide or dielectric), Cgb is the capacitance between the gate 115 and the body substrate, and CL is the capacitance of the external load.

The equivalent ON and OFF load capacitances to ground, CL(ON) and CL(OFF), respectively, include the external load CL. The internal capacitances of the gated diode are also shown. Exemplary equations suitable for modeling and that use the representative circuit of FIG. 1C are as follows, where "ON" indicates that the gated diode is turned on and "OFF" indicates that the gated diode is turned off:

$R(ON)$ = small;
$Cgd(ON)$ = $Cov + Cox$;
$CL(ON)$ = $CL$;
$R(OFF)$ = large;
$Cgd(OFF)$ = $Cov$;
$CL(OFF)$ = $CL + CoxCgb/(Cox + Cgb)$;
       ~ $CL + Cgb$;

$Cox \gg Cgb, Csb$.

For example, when the gated diode is OFF, the gate to body capacitance is equal to Cox in series with Cgb. Adding this to CL gives the equivalent OFF load capacitance CL(OFF).

FIG. 1D shows an example of a side view cross-section of a first n-type gated diode 600 formed in Silicon-On-Insulator (SOI). The first n-type gated diode 600 comprises a gate insulator 620 formed between a gate 615 (e.g., N+ doped polysilicon) and a p-well 630, a source diffusion region 610, two STI regions 605 and 625, and an insulator 635. The p-well 630 is formed above well boundary 636. The dopant concentration in p-well 630 substantially controls the threshold voltage of the gated diode 600.

Figure 1E:
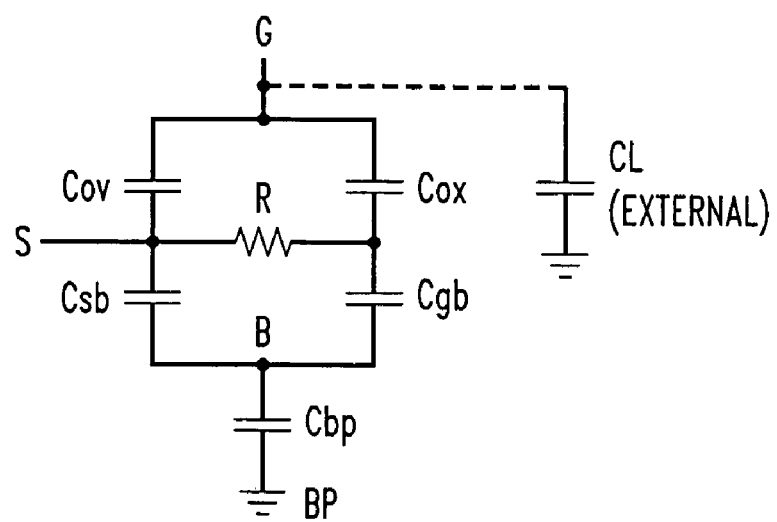
FIG. 1E shows an exemplary representative circuit used for modeling the first n-type gated diode shown in FIG. 1D.

FIG. 1E shows an exemplary equivalent circuit used for modeling the first n-type gated diode shown in FIG. 1D. In FIG. 1E (with appropriate reference to FIG. 1D), R, Cov, Csb, Cox, Cgb, and CL are defined as above, where the body of the gated diode 600 is the volume of the p-well 630 under the gate 615 and between the source 610 and the STI region 625. Additionally, Cbp is the capacitance between the body and the insulator 635.

Exemplary equations suitable for modeling and that use the representative circuit of FIG. 1E are as follows, where "ON" indicates that the gated diode is turned on and "OFF" indicates that the gated diode is turned off:

R(ON)=small;
Cgd(ON)=Cov+Cox;
CL(ON)=CL;
R(OFF)=large;
Cgd(OFF)=Cov+CsbCgb/(Csb+Cgb);
CL(OFF)=CL;
Cox>>Cgb, Csb>>Cbp.

FIG. 2A shows exemplary symbols used for a second n-type gated diode. Symbol 190 is an exemplary symbol for a second n-type gated diode shown in FIG. 2B. The same symbol 190 is used for both FIGS. 1A and 2A. FIG. 2B shows an example of a side view cross-section of the second n-type gated diode 200 formed in a semiconductor. The second n-type gated diode 200 comprises a gate insulator 220 formed between a gate 215 (e.g., N+ doped polysilicon) and a p-well 230, a source diffusion region 210, two STI regions 205 and 225, an optional n isolation band 240, a p-substrate 235, a "drain" diffusion region 245, and a coupling 250 that electrically couples source diffusion region 210 and drain diffusion region 245. As described below, the dopant concentration in p-well 230 substantially controls the threshold voltage of the gated diode 100.

Figure 3:
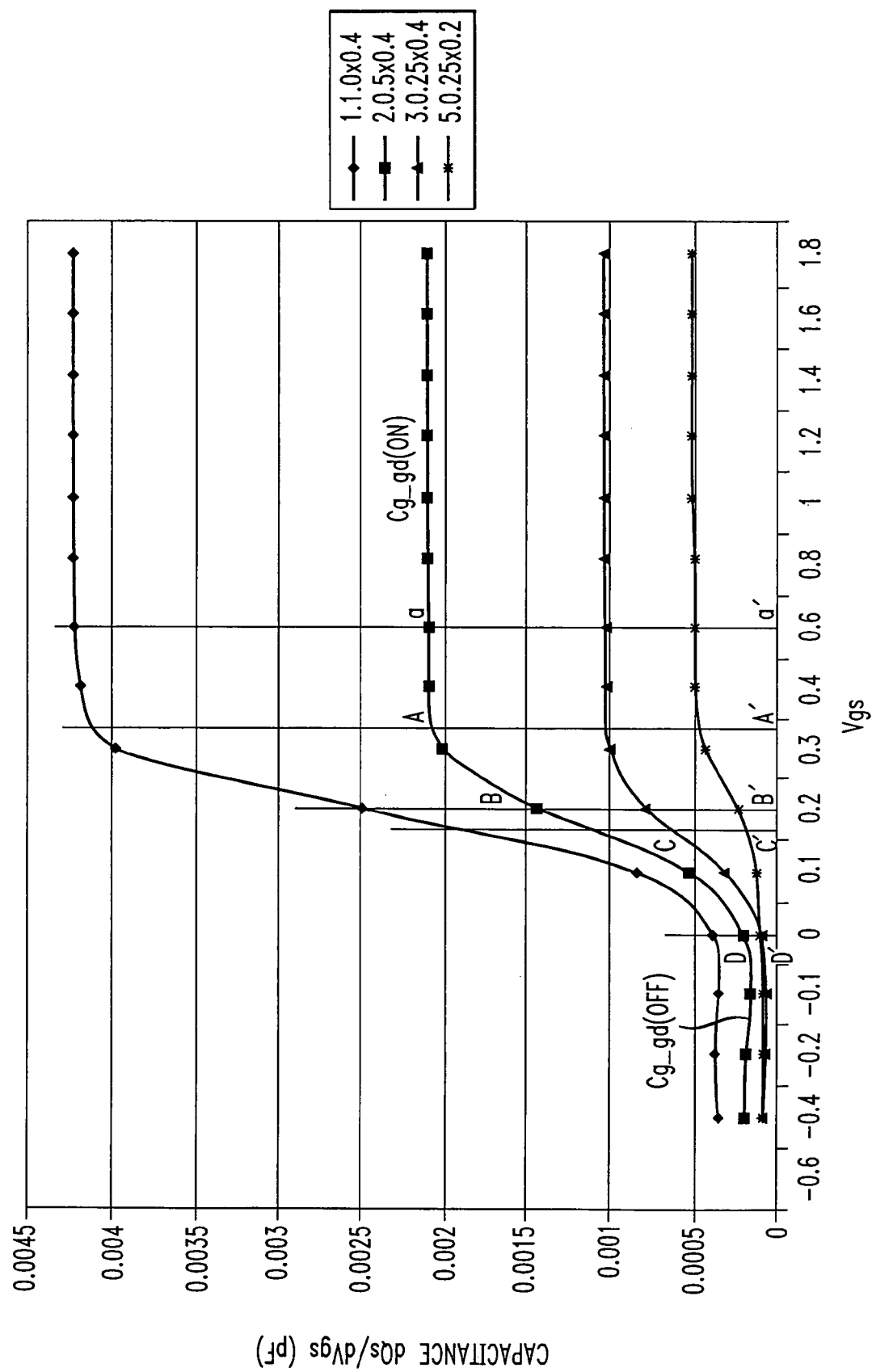
FIG. 3 is a graph illustrating typical capacitance of the gate capacitance Cgs (obtained by the derivative of charge with respect to voltage, dq/dv) versus voltage between the gate and source (Vgs) for an n-type gated diode in bulk silicon, for a number of different gate areas.

FIG. 3 is a graph illustrating typical capacitance of the gate capacitance Cgs (obtained by the derivative of charge with respect to voltage, dq/dv) versus voltage between the gate and source (Vgs) for an n-type gated diode in bulk silicon, for a number of different gate areas. The gate capacitance Cgs includes the gate Metal Oxide Semiconductor (MOS) capacitance formed by the dielectric under the gate and the overlap capacitance, Cov, between the gate and the source, excluding the gate to body and the source to body capacitances. Each curve corresponds to a gated diode having a certain gate area.

Curve ABCD shows the gate capacitance versus Vgs curve of a gated diode with a threshold voltage, Vt, of 0.16V (point C) and certain gate area. When Vgs is above Vt, there is a substantial amount of charge stored in the inversion layer (point A); and when Vgs is below Vt, the amount of inversion charge is orders of magnitude smaller (point D). The gate to source ON capacitance reaches maximum at point A. The maximum is approximately 150 millivolts (mV) above Vt with Cg_gd(ON) of about 2.1 femtofarads (fF). When Vgs is below Vt, the gate to source OFF capacitance reaches minimum at point D, which is about 150 mV below Vt with Cg_gd(OFF) of about 0.2 fF. Below Vt, the inversion charge and capacitance are absent, and only the overlap capacitance between gate and source is present. The capacitance changes drastically around Vt (point C in FIG. 3) and its value levels off quickly to about 150 mV beyond Vt. The threshold voltage (Vt_gd) can be controlled by the amount of implanted dopant, which is a key parameter in circuit design. Those skilled in the art should know that the amount of implant dopant can trade off margins of signal, noise, and Vt variation. A low dopant level giving Vt_gd 50 to 100 mV can be beneficial to provide a good amount of charge and voltage for one-data (e.g., data that represents a "one"), and sufficient separation from ground noise.

In this disclosure, if it is not mentioned explicitly, a gated diode is assumed to be an n-type, as well as the associated NFET and PFET (transistors) in the corresponding circuits. For p-type gated diode, as well as the associated PFET and NFET (transistors) in the corresponding circuits, voltages and operations are complementary to the n-type case, and can be readily designed correspondingly, by someone who is skilled in the art.

Figure 4A:
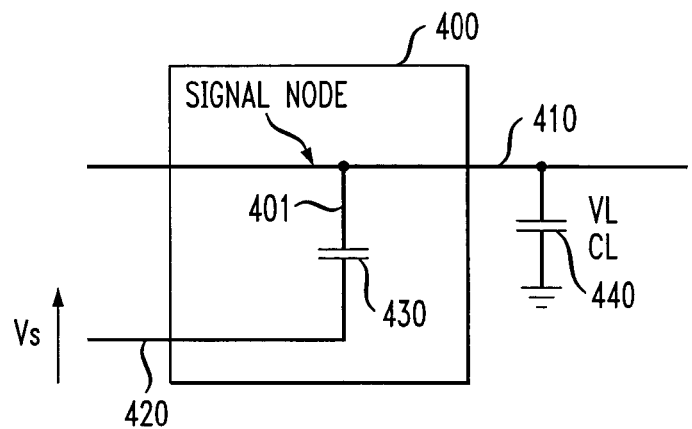
FIG. 4A shows an example of a voltage boosting circuit using a capacitor.

Turning now to FIG. 4, a voltage boosting circuit 400 is shown using a capacitor 430 as a charge storage device. Amplifier 400 is coupled to a signal node 410, and has a capacitor 430 whose first terminal is coupled to the signal node 410 and whose second terminal is coupled to a set line 420. The signal node 410 has a capacitance 440 of CL, which is the lumped capacitance from the signal node 410, plus the coupling capacitance and the total capacitance of the connecting circuits (if there is any capacitance) to the signal node. The capacitive load (CL) is not considered part of the amplifier 400.

During signal boosting, the set line voltage (Vs) on the set line 420 is raised or boosted. Following the set line voltage, the source voltage of the signal node 410 is also therefore boosted by certain amount (denoted by VB), typically 50 percent to 100 percent of the supply voltage (VDD). The magnitude of the set line voltage (Vs) can be a predetermined voltage of a digital signal or its magnitude can be varied to give the amount of voltage boosting needed, as the boosted voltage on the signal node 410 (after Vs is raised) depends on the magnitude of the set line voltage, as well as the characteristic of the gated diode and the load capacitance CL.

Figure 4B:
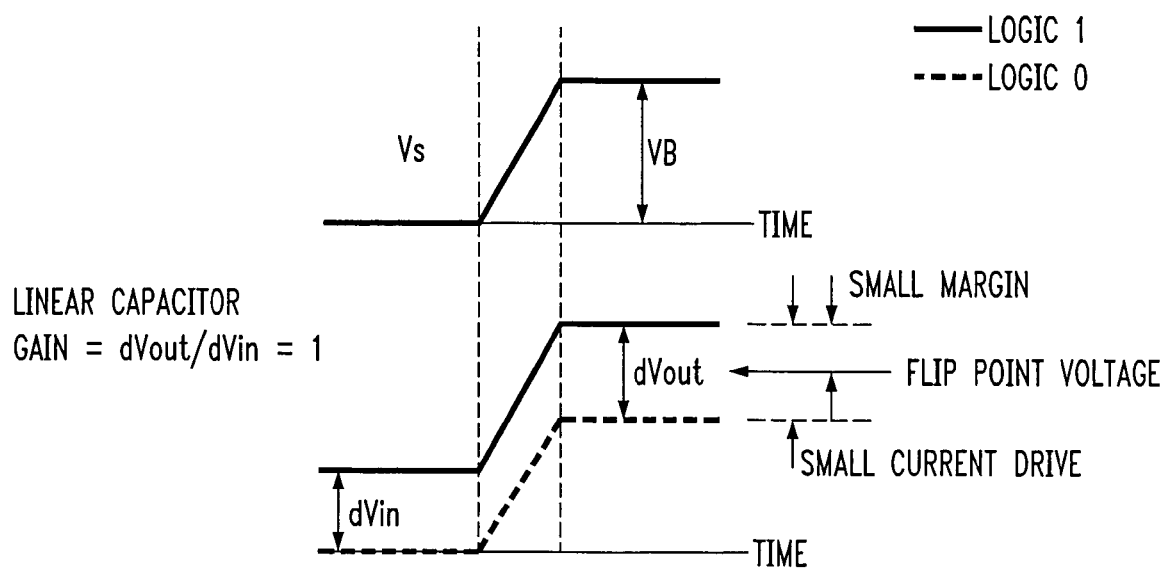
FIG. 4B shows graphs illustrating gain for the voltage boosting circuit of FIG. 4A.

Referring now to FIG. 4B, graphs are shown illustrating gain for the voltage boosting circuit 400. The first graph, Vs, shows how the voltage varies on the set line 420. The second graph shows how the voltage at the point 401 would vary. As seen in FIG. 4B, the gain is about one for the voltage boosting circuit 400. If the signal node 410 has a high voltage, the output will be VB plus the high voltage (data one). If the signal node 410 has a low voltage, the output will be VB plus the low voltage (data zero). The difference, dVin, is whatever difference exists between the data one and data zero voltages. Thus, the gain, which is dVout divided by dVin (the data one voltage minus the data zero voltage) is about one. Additionally, the flip point voltage, which is the voltage at which a decision is made as to whether a data one or data zero is seen, is relatively small if this circuit is used for signal detection. In other words, the signal margin of this circuit 400 is relatively small, and its current driving capability measured by dVout for driving an output buffer or an inverter or a latch is relatively small compared to a gated diode amplifier which will be described next.

Figure 5A:
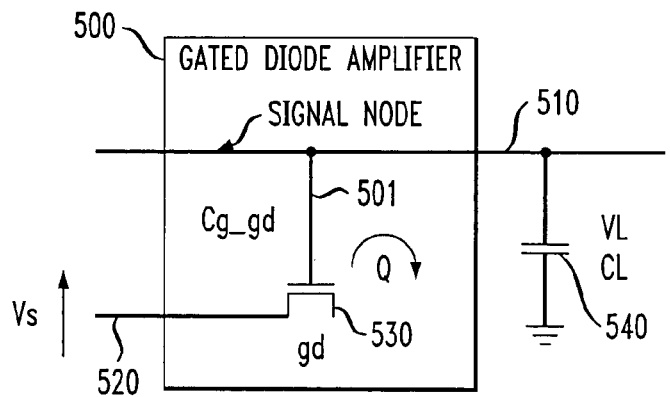
FIG. 5A shows an example of a gated diode voltage boosting circuit used for an amplifier.
Figure 5B:
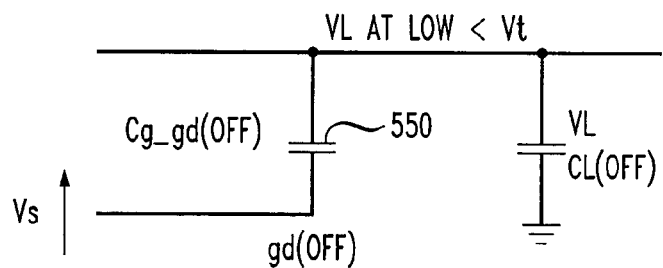
FIG. 5B shows an exemplary representative circuit for the gated diode amplifier of FIG. 5A when the gated diode is turned OFF.
Figure 5C:
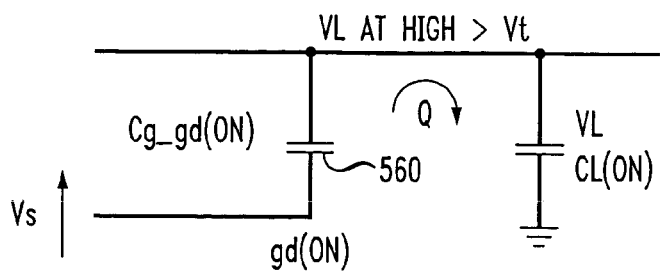

FIGS. 5A, 5B and 5C illustrate exemplary principles of operation of a gated diode amplifier 500. In FIG. 5A, a gated diode amplifier 500 is shown. Gated diode amplifier 500 is coupled to a signal node 510, and has a gated diode 530 whose gate terminal (and therefore gate) is coupled to the signal node 510 and whose source terminal (and therefore source diffusion region) is coupled to a set line 520. The load capacitance CL(ON) and CL(OFF) for ON or OFF, respectively, includes the lumped total of external load capacitance CL and the internal equivalent capacitance from the gated diode, as summarized in FIGS. 1C and 1E. The capacitive load (CL) is not considered part of the gated diode amplifier 500. A control voltage Vs is connected to the source of the gated diode. To operate the gated diode amplifier 500, the voltage at the source of the gated diode is raised.

Let the gated diode gate to source ON capacitance be Cg_gd(ON), and OFF capacitance be Cg_gd(OFF). Let Rc=Cg_gd(ON)/CL(ON) and rc=Cg_gd(OFF)/CL(OFF). The total load CL(ON) and CL(OFF) are lumped capacitance at the signal node to ground, and these may include the gate to source capacitance of a next stage FET, any stray capacitance on the signal node to ground, as well as some internal device capacitance of the gated diode, e.g., the gate to body capacitance of the gated diode when it is OFF.

As shown in FIG. 5C, VL_HIGH is the voltage level for a "one" (e.g., data one), and VL_HIGH>Vt_gd. There is a substantial amount of charge stored, given by (VL_HIGH−Vt_gd) Cg_gd(ON), represented by point a or A in FIG. 3. The stored charge effectively causes a large capacitance, so that the gated diode 530 may be represented as large capacitor 560. When Vs is raised by VB, there is a large voltage increase at the gate of the gated diode. The maximum voltage is given by VL_HIGH+VB Rc/(1+Rc). The final value Vg_f depends on the amount of charge stored and transferred, and Rc.

As shown in FIG. 5B, VL_LOW is the voltage level for a "zero" (e.g., data zero), and VL_LOW<Vt_gd. When Vs is raised, the voltage at the gate stays almost zero since Cg_gd(OFF) (point D in FIG. 3) is much smaller than CL(OFF). The charge stored effectively causes a small capacitance, so that the gated diode 530 may be represented as small capacitor 550. The voltage is given by VL_LOW+ VB rc/(1+rc).

If Rc>>1, there is enough charge in the gated diode to transfer to the load CL(ON), without affecting the gated diode ON capacitance significantly (e.g. from point a to A to B in FIG. 3). The gated diode is operating under the constrained charge transfer mode. For instance, VL_HIGH=0.6V (point a in FIG. 3), VB=1.2V, if final gate voltage (Vg_f)=1.4V, then the final Vgs of the gated diode=0.2V (point B in FIG. 3). The charge transfer out from the gated diode to the load CL(ON) is the area under the curve a-B in FIG. 3, represented by the area enclosed by a-B-B'-a'.

When $Cg\_gd(ON) \gg CL(ON)$ and $CL(OFF) \gg Cg\_gd(OFF)$, the output voltage at the gate can be approximately by:

$$Vout(1) = VL\_HIGH + VB\ Rc/(1+Rc); \text{ and}$$

$$Vout(0) = VL\_LOW + VB\ rc/(1+rc).$$

Figure 6:
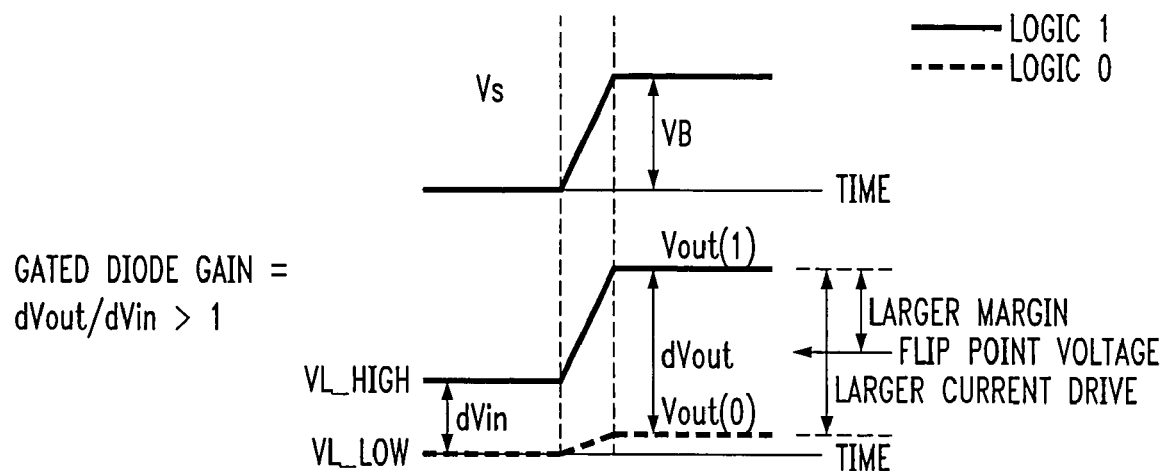
FIG. 6 shows graphs illustrating gain for a gated diode amplifier when a gated diode is used as the charge storage and transfer device.

As shown in FIGS. 4B and 6, let dVin be the difference of the gate voltage between data zero and data one before Vs is raised, and dVout be such difference after Vs is raised. Typically, VL_LOW=0. In the case of a linear capacitor amplifier (see FIG. 4), the capacitance is constant throughout for data zero and data one, dVin=dVout, so the gain is one. In the gated-diode case (see FIG. 6), $$dVout = VL\_HIGH + VBRc/(1+Rc) - (VBrc/(1+rc) + VL\_LOW);$$

$$dVin = VL\_HIGH - VL\_LOW;$$

$$gain = dVout/dVin;$$

$$= 1 + (VB/VL\_HIGH)[Rc/(1+Rc) - rc/(1+rc)] > 1.$$

For example, VB=1.2V, VL_HIGH=0.6V, VL_LOW=0, rc=0.1, Rc=9, dVout=1. dVin=0.6V, gain=2.62.

In addition to the gain advantage of a gated diode amplifier 500 as compared to a linear capacitor voltage boosting circuit 400, the gated diode amplifier 500 provides more margins for voltage distinction at the output stage. Without loss of generality, assume an inverter with its input connected to the signal node is used to detect data zero or data one. The data zero and data one voltage levels of the linear capacitor case and the gated diode case are shown in FIGS. 4 and 6, respectively. The zero to one flip point voltage would be selected mid-way between the voltage outputs for the data zero and data one. The flip point voltage is the mid-point of dVout shown in FIGS. 4 and 6 for the cases of the linear capacitor and the gated diode case, respectively. The detection margin can be defined as dVout/2. Since the gated diode amplifier 500 has a much higher dVout, it has a much higher margin of error to separate data zero and data one, as compared to a linear capacitor voltage boosting circuit 400. Further, the output current of the inverter are determined by its input overdrive voltage, which is |Vout−Vt| for both P-type FETs (PFETs) and N-type FETs (NFETs). Such overdrive equates to dVout for both data zero and data one. Since dVout is much larger for the gated diode case, output current of the gated diode amplifier 500 is higher and its speed is faster compared to the linear capacitor voltage boosting circuit 400.

Let Vg_f be the final gate voltage. The final voltage across the gated diode is (Vg_f−VB) and it is less than the initial voltage VL_HIGH. Let Vxfer be the decrease of voltage across the gated diode, Vxfer=VL_HIGH+VB−Vg_f. Part or all of the charge in the gated diode is transferred to the load as the load voltage increases from VL_HIGH to Vg_f. The charge transfer to the load CL(ON) Qxfer is given byps $$Qxfer = (Vg\_f - VL\_HIGH)CL(ON) = (VB - Vxfer)CL(ON).$$

Qxfer is given by the area under the capacitance-Vgs curve between VL_HIGH and (Vg_f−VB) (points a-B in FIG. 5). Vg_f can then be determined graphically or numerically from Qxfer. For example, initially Vgs(at point a)=VL_HIGH, charge transfer is represented by moving from point a to B, and the final voltage is given by point B. Vg_f=VB+Vgs(at point B). The gain can then be calculated by $$gain = dVout/dVin = (Vg\_f - VB\ rc/(1+rc))/VL\_HIGH.$$

For completeness, for small Rc, all the charge stored in the gated diode is transferred to the load, the complete charge transfer mode, represented by curves B-D, A-D or a-D in FIG. 3. The gated diode is turned OFF. The final voltage at the gate Vg_f is given by the following:

$$Qxfer = (VL\_HIGH - Vt\_gd)Cg\_gd(ON)$$

$$= (Vg\_f - VL\_HIGH)CL(ON);$$

$$Vg\_f = VL\_HIGH - Vt\_gd)Cg\_gd(ON)/CL(ON) + VL\_HIGH;$$

$$Vg\_f = (VL\_HIGH - Vt\_gd)Rc + VL\_HIGH; \text{ and}$$

$$gain = dVout/dVin$$

$$= (Vg\_f - VBrc/(1+rc))/VL\_HIGH$$

$$= 1 + Rc(1 - Vt\_gd/VL\_HIGH) - VB/VL\_HIGH\ rc/(1+rc)$$

$$\sim 1 + Rc(1 - Vt\_gd/VL\_HIGH)(\text{when } rc \ll 1).$$

When the source voltage returns to ground, the charge that transferred out of the gated diode to CL(ON) will return back to the gated diode, the gate voltage will return to the pre-boosted value, and the total charge stored in the gated diode and its load is conserved before and after the read.

Figure 7:
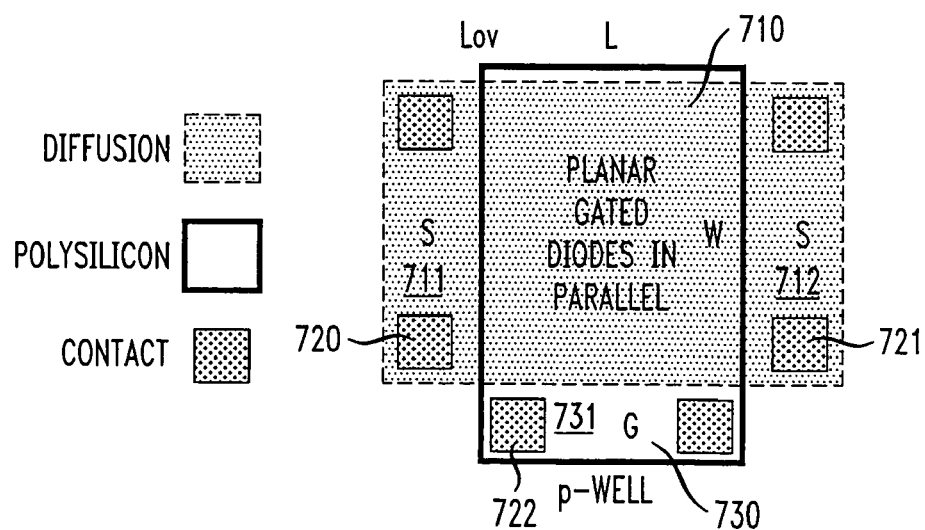
FIG. 7 shows an example of a top view of two of the first n-type gated diode formed in a semiconductor.

Referring now to FIG. 7, a top view is shown of two of the first n-type gated diodes formed in a semiconductor. Two planar gated diodes are formed by source area 711, 712 of a diffusion 710 underneath a polysilicon gate area 730 that forms a gate 731. One gated diode is formed by source region 711 and gate 731, while another gated diode is formed by source region 712 and gate 731. Contacts 720, 721, 722 are provided to contact the source areas 711, 712 and the gate 731 respectively. The two gated diodes can be connected in parallel, implementing a structure as shown in FIG. 2B, by external metal connections and contacts. If only one side of the source area 711 or 712 is present, then a single gated diode is formed with gate 731 and source 711, or with gate 731 and source 712, implementing structures as shown in FIG. 1B and FIG. 1D.

The variables L, W, and Lov are the following: L is the gate length, W is the gate width, and Lov is the overlap length between the gate and the source. The gain is as follows:

$$\text{Gain} \sim 1 + [Cox/(Cox+CL) - Cov/(Cov+CLoff)]VB/VL\_HIGH.$$

VB, VL_HIGH, Cox, Cov have been defined earlier. To improve gain, Cox should be large and Cov should be small. It is recommended that L≫Lmin and W≫Wmin, where Lmin and Wmin are the minimum sizes determined by the technology being used. A reasonably sized Cox is approximately two to ten times CL. Selection of L≫Lmin, W≫Wmin and a reasonably sized Cox has exemplary benefits of the following:

reduced dL induced Vt fluctuation;

reduced short channel effect;

the carrier transit time<a Resistance-Capacitance (RC) requirement; and increased Cox/Cov=L/Lov, hence achieving higher GAIN.

The following are also recommended: (1) low Vt=50-100 mV, which stores more charge, allowing small signal (e.g., 200 mV) to be sensed; and (2) low dose ion implantation and low background doping concentration, which cause less dN/N dopant fluctuation, less change in oxide thickness (dTox) fluctuation effect on Vt, and smaller Vt fluctuation.

The precision of the Vt of the gated diode helps allow a gated diode amplifier to detect small signals accurately. It is desirable to have the Vt midway between the low and high of the small signal voltage to distinguish between the data zero and data one. More importantly, the Vt variation of the gated diode should be small over various manufacturing process and wafer variations, in order to avoid giving false zero indications when Vt shifts up, and false one indications when Vt shifts down. The allowable percentage variation in Vt of the gated diode should be even smaller than that allowed for logic gates due to the small magnitude of the signal. The gated diode can be designed with low Vt and low dopant concentration, which would provide minimal Vt variation and maximal signal detection separation. The short channel or roll-off effect for short channel logic devices is typically not an issue because the gated diode has no drain voltage to induce Drain-Induced Barrier Lowering (DIBL) effect.

Since the gated diode should be a certain size to achieve the required gated diode capacitance to load capacitance ratio to achieve the required gain as described above, the channel length of gated diode is not necessarily of minimal channel length like the rest of the FET devices used for logic. In order to maximize the gain, it is beneficial if the ratio of the gated diode ON and OFF capacitance is as highest possible. Consequently, the capacitance Cox to the gate to source overlap parasitic capacitance Cov should be as large as possible for a given gate capacitance Cox. Since Cox/Cov=L/Lov, L should be made as large as possible provided that the threshold profile variation and the RC delay for carrier transport is within certain requirements known to those skilled in the art.

Sense Amplifier Circuits Using Gated Diodes

Figure 8:
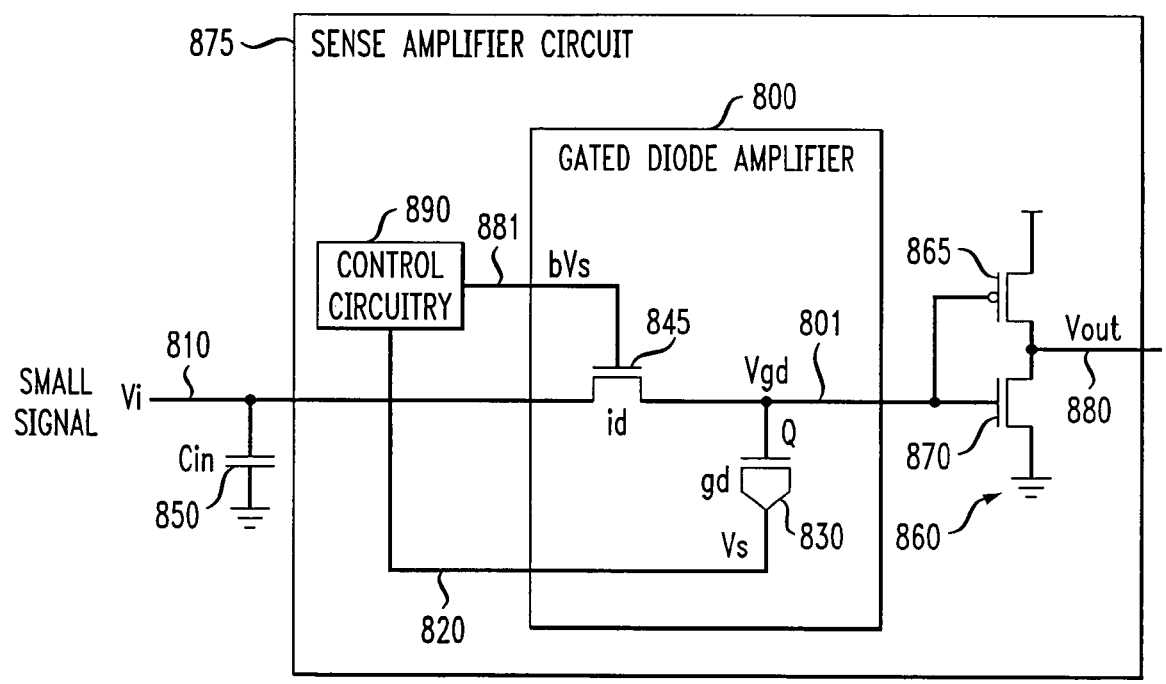
FIG. 8 is an example of a gated diode sense amplifier circuit using a fixed control voltage on an isolation device.

Turning now to FIG. 8, a sense amplifier circuit 875 is shown coupled to a signal line 810 adapted to carry a small signal, Vi. The sense amplifier circuit 875 comprises control circuitry 890, a gated diode amplifier 800, and an optional output device 860. The gated diode amplifier 800 comprises an isolation device 845 and a gated diode 830. The optional output device 860 is typically a latch or buffer. In the example of FIG. 8 and in the following examples, the output device 860 is an inverter, which is one type of buffer. However, other types of latches or buffers may be used in place of the inverter, for those who are skilled in the art. The output device 860, an exemplary inverter comprises a PFET 865 and an NFET 870. The sense amplifier circuit 875 is coupled to an output line 880 and produces an output signal, Vout. The control circuitry 890 is coupled, in the illustration of FIG. 8, to a control terminal of the isolation device 845 through an isolation device control line 881 and to the set line 820. The input capacitance, Cin, is represented by capacitor 850. The sense amplifier circuit 875 is coupled to a signal line 810 having a small signal, Vi, placed thereon. The signal line has a capacitance, Cin, illustrated by capacitor 850 and described in more detail below.

The isolation device 845 and other PFET and NFET devices described herein can be considered to be switches, where a voltage that is within a predetermined voltage range and that is applied (e.g., through a control line) to control terminals of the devices causes an electrical connection between a first terminal of the devices and between a second terminal of the devices. In the example of the isolation device 845, the appropriate voltage on the control terminal will electrically couple a small signal, Vi, to a first terminal of the gated diode 830 and to control terminals on the PFET 865 and the NFET 870. The switch (e.g., the isolation device 845) is turned ON (e.g., enabled). Similarly, a voltage that is not within the predetermined voltage range and that is applied (e.g., through the isolation device control line 881) to the control terminal of the isolation device 845 causes an electrical disconnection between the first terminal of the isolation device 845 and the second terminal of the isolation device 845. The switch (e.g., the isolation device 845) is turned OFF (e.g., disabled). The threshold voltage of the isolation device 845, ground voltage and the power supply voltage (VDD) typically define the predetermined voltage range for P-type and N-type switches, such as PFETs and NFETS. The PFET 865 and NFET 870 may also be considered to be switches.

In FIG. 8, an isolation device 845 is added to the basic form of gated diode amplifier 500 (see FIG. 5A) between the gated diode 830 and the signal line 810 to handle signal lines with high capacitive load, as indicated by Cin and capacitor 850. The gate of the gated diode 830 is isolated from the signal line 810 and signal source (not shown) so that the signal line 810 and the signal source do not load the sensing node 801. The gated diode 830 is used to create a non-linear boosting of the voltage at the sensing node 801, as described earlier. The isolation device 845 isolates the signal line from the sensing node, where the load CL is only for the node Vgd (e.g., the sensing node 801) including the input capacitance of the output device 860 and the parasitic capacitances of the gated diode 830 and the isolation device 845.

The isolation device 845 can be implemented either with a carefully chosen constant voltage Vc applied at the gate, such as described in "Amplifiers Using Gated Diodes," already incorporated by reference above, or with a separate digital signal to switch the isolation device 845 to ON to pass the small signal, Vi, to the gated diode, and OFF to isolate the gated diode from the signal source, typically after the small signal Vi is sampled and stored in the sensing node 801 during the ON phase. The present disclosure describes using a digital signal to control the voltage on the control terminal of the isolation device 845. A digital signal is a signal controlled to turn the isolation device 8450N and to turn the isolation device 845 OFF, typically with two different voltages.

By controlling the voltage on the control terminal of isolation device, sensing speed may be increased as compared to using a constant voltage for the isolation device 845. Additionally, when there is a constant voltage on the control terminal of the isolation device 845 and the voltage at sensing node 801 is a predetermined voltage, the isolation device can be turned off. However, even when off, there may be a small amount of leakage (e.g., voltage, current, or both) from the signal line 810 to the point 801, e.g., when a FET is used as the isolation device 845. When the control circuitry 890 is used to digitally switch (e.g., using the isolation device control line 881) the voltage on the control terminal of the isolation device 845, this small amount of leakage can be reduced or eliminated.

In the example of FIG. 8, the control circuitry 890 raises voltage of a sampling signal, bVs, during a sampling operation, and produces a sampling signal, bVs, on the control terminal, connected to the control line 881. The sampling signal, bVs, is the complement of the set signal, Vs. After the sampling operation, the control circuitry 890 will lower the sampling signal, bVs. There are a number of operations that a sense amplifier circuit, such as sense amplifier circuit 875, typically supports. In a sampling operation, the small signal (Vi) is sampled so that a voltage corresponding to the small signal is stored and then typically isolated at sensing node 801 after the gated diode 845 is turned OFF. In a sensing operation, the set signal, Vs, on the set line 820 is raised (e.g., by the control circuitry 890) so that an appropriate sensed output corresponding to the sampled voltage, isolated at sensing node 801, is output as output signal, Vout. As described in more detail below, these two operations, namely sampling and set, may be separated by a certain time period or may overlap.

In general, as described earlier, the magnitude of Vs can be a predetermined voltage of a digital signal or it can be made adjustable to give the desired voltage boosting needed for the gated diode amplifier.

Figure 9:
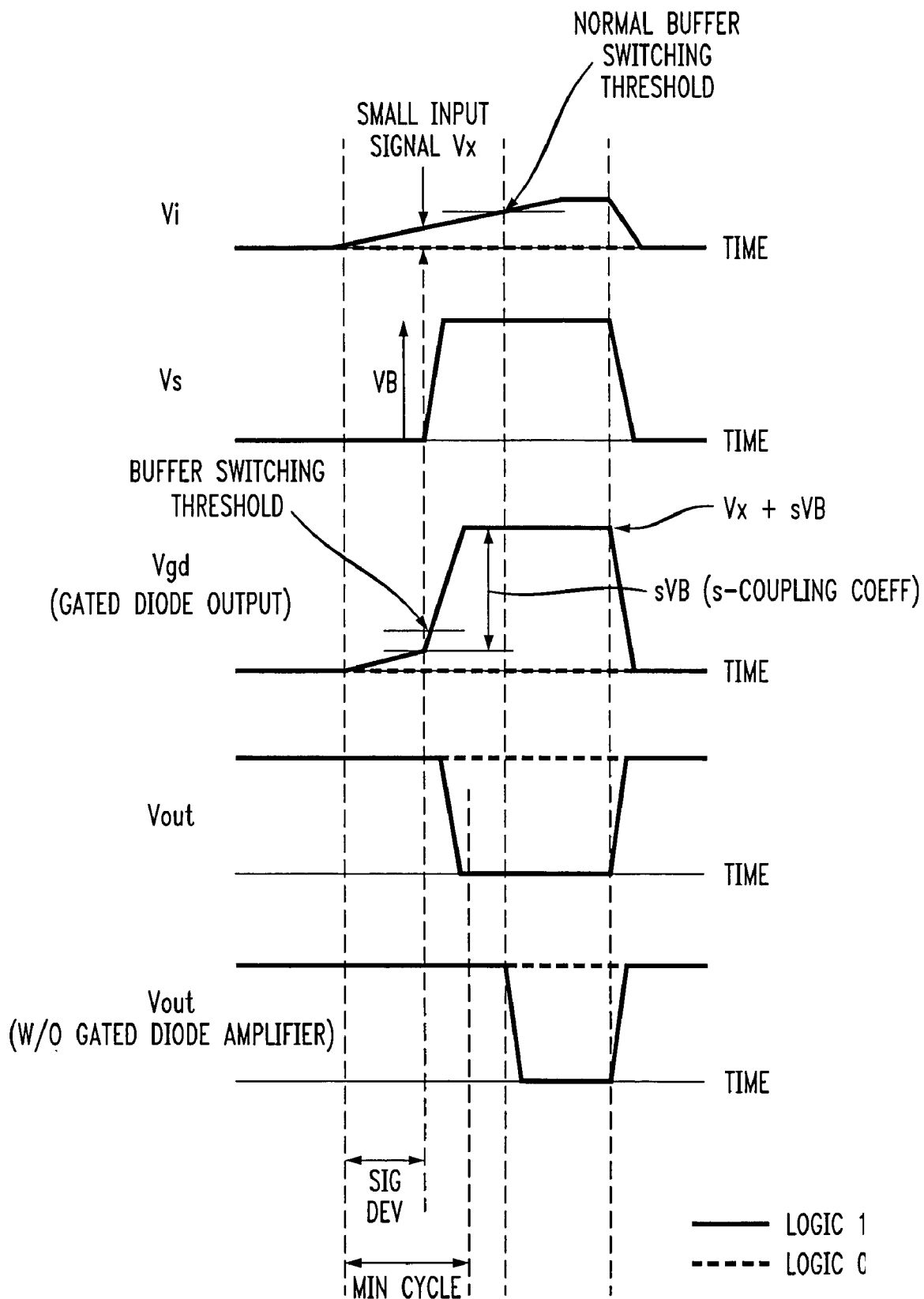
FIG. 9 shows a number of waveforms for the sense amplifier circuit of FIG. 8.

Referring now to FIG. 9, a number of waveforms are shown for the sense amplifier circuit of FIG. 8. FIG. 9 also compares waveforms of a gated diode sense amplifier 875 with waveforms produced by a typical sense amplifier. A waveform for the small signal, Vi, on the signal line 810 is shown first. A waveform for the set signal, Vs, is shown. Note that the sampling signal, bVs, is the complement of Vs. A waveform for sensing node 801, which is the gated diode output, is shown next. A waveform for the output signal, Vout, on output line 880 is shown. For comparison purposes, the final waveform shows an output signal, Vout, from conventional sense amplifier circuit.

It can be seen in FIG. 9 that the sense amplifier circuit 875 with a gated diode amplifier 800 produces an output signal, Vout, faster than a conventional sense amplifier circuit.

Figure 10:
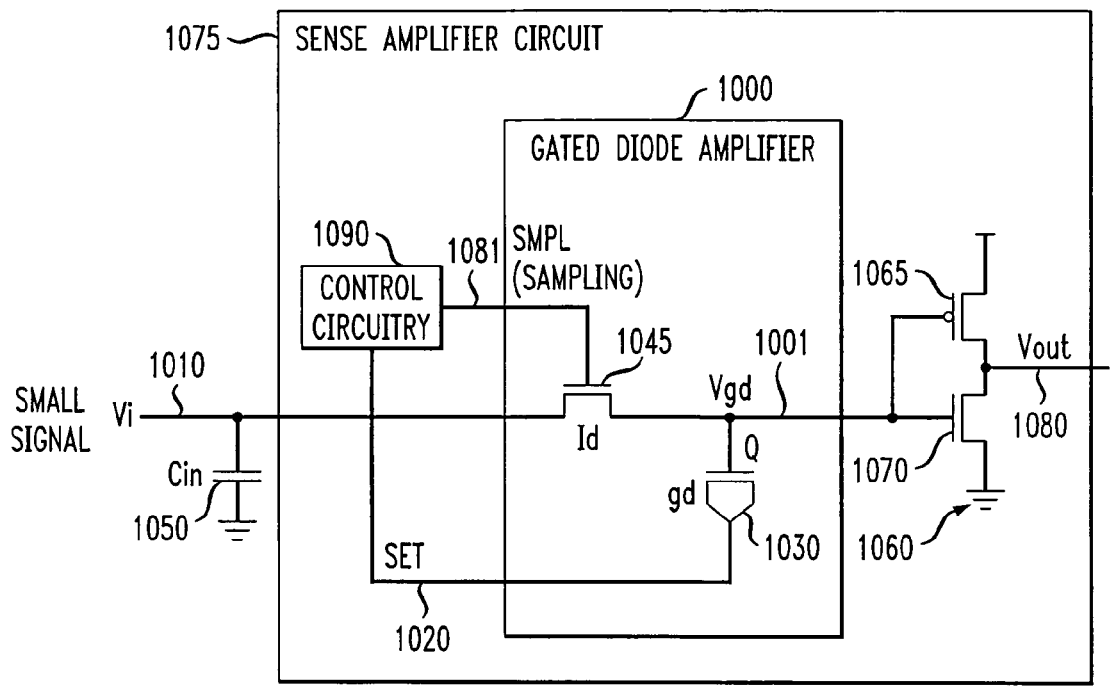
FIG. 10 is an example of a sense amplifier circuit using a gated diode amplifier and control circuitry adapted to control certain elements of the amplifier circuit.

FIG. 10 is an example of another sense amplifier circuit 1075 using a gated diode amplifier and control circuitry adapted to control certain elements of the amplifier circuit. Sense amplifier circuit 1075 is shown coupled to a signal line 1010 adapted to carry a small signal, Vi. The sense amplifier circuit 1075 comprises control circuitry 1090, a gated diode amplifier 1000, and an optional output device 1060. The gated diode amplifier 1000 comprises an isolation device 1045 and a gated diode 1030. The optional output device 1060 comprises an inverter having a PFET 1065 and an NFET 1070. The sense amplifier circuit 1075 is coupled to an output line 1080 and produces an output signal, Vout. The control circuitry 1090 is coupled to a control terminal of the isolation device 1045 through an isolation device control line 1081 and to the set line 1020. The input capacitance, Cin, is represented by capacitor 1050. In this example, the isolation device control line 1081 has a sampling signal thereon, SMPL, and the set line has a set signal, SET, thereon. For an operation of sampling, one exemplary technique used is as follows. The control circuitry 1090 adjusts the following signals, where "high" is a predetermined high voltage and a "low" is a predetermined low voltage:

SMPL=high; and
SET=low, such that the isolation device 1045 is ON. The small signal, Vi, is sampled and stored at node Vgd at point 1001. The small signal is stored at point 1001 even after SMPL goes to zero.

For an operation of sensing, one exemplary technique used is as follows. The control circuitry 1090 adjusts the following signals:

SMPL=low;
SET goes from low to high to boost Vgd.
If Vgd is low, Vout stays high. On the other hand, if Vgd is high, Vout falls to low. As described above in reference to FIGS. 8 and 9, the signals of SMPL and SET can be complementary. Alternatively, the SMPL signal can be turned off sooner than the SET signal goes high.

As another example, assume that the sampling signal SMPL is the complement of SET (bSET) logically, such that SET is a delayed complement of SMPL. During a sampling operation, when SMPL=high (or bSET=high) and SET=low, the small signal is sampled, so that the small signal passes through the isolation device 1045 and is held temporarily at Vgd (the sensing node 1001) by the capacitance of the gate of the gated diode 1030 and the gates of the PFET 1065 and NFET 1070 of the output device 1060. At the end of the sampling operation, SMPL=low and the sampled small signal voltage is held by the capacitance at the sensing node 1001 as Vgd as the isolation device 1045 is turned OFF. During the sensing operation, the set signal, SET, switches to high (SMPL=bSET=low), and the isolation device 1045 has been turned OFF. For corresponding data one, the gated diode 1030 then boosts the temporarily held small signal Vgd to full logic swing, and for data zero, Vgd remains low. The full logic swing of Vgd corresponding to data zero and to data one would then be output via the output device 1070, and a voltage corresponding to the output signal 1080 can then be stored or passed to subsequent logic stage.

In general, as described earlier, the magnitude of SET signal can be a predetermined voltage of a digital signal or it can be made adjustable to give the desired voltage boosting needed for the gated diode amplifier.

After the sensing operation, the SET signal on set line 1020 returns to low and the SMPL signal on the isolation device control line 1081 returns to high to complete a SMPL and SET sensing cycle. Even under heavy input line loading, the sense amplifier circuit 1075 can achieve very fast switching time, since the gated diode 1030 loading-can be limited to a very small amount equivalent to about the loading of minimum feature size. For use in a bank or a large number of sense amplifiers, the two SMPL and SET signals can be shared among many gated diode amplifiers 1000.

The exemplary sense amplifier circuit 1075 works in a way that the isolation device 1045 can be controlled digitally, without the need to set Vc precisely. As a result, the sense amplifier circuit 1075 is robust and tolerant to Vt variation, voltage, temperature and process variation. The isolation device 1045 can be used as part of a multiplexer (MUX) network to control the signal flow of the small signal into the gated diode amplifier from one of many sources.

Figure 11:
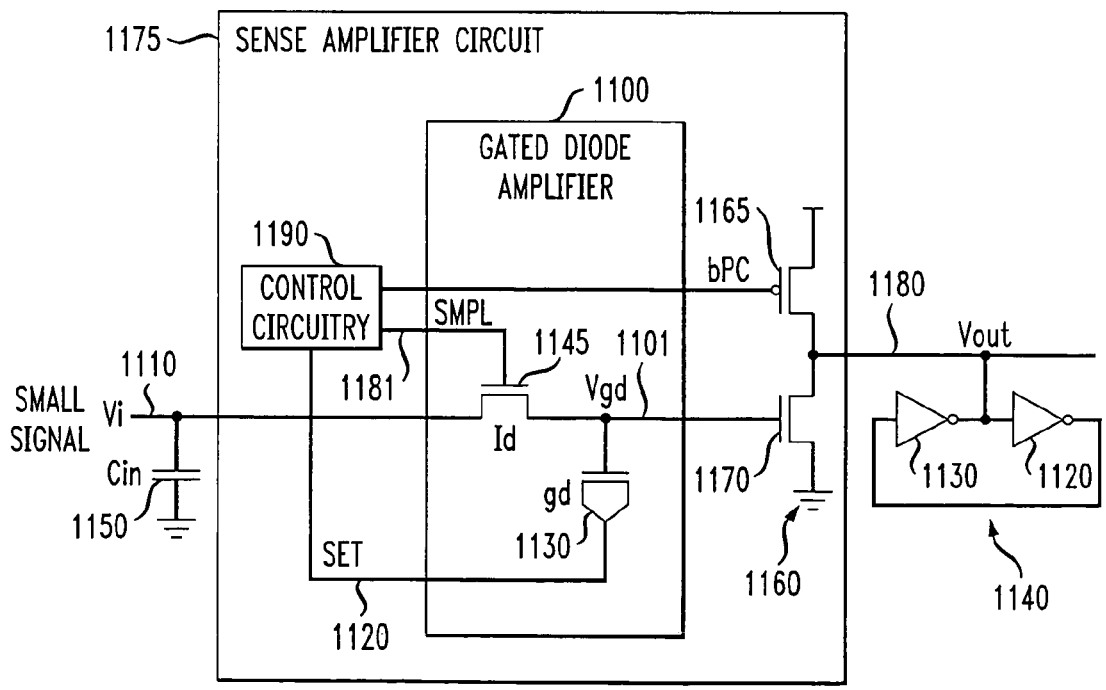
FIG. 11 is another example of a sense amplifier circuit, interfacing with an optional keeper circuit, using a gated diode amplifier and control circuitry adapted to control certain elements of the amplifier circuit.

Turning now to FIG. 11, another example of a sense amplifier circuit 1175 is shown. Sense amplifier circuit 1175 is shown coupled to a signal line 1110 adapted to carry a small signal, Vi, and having an input capacitance of Cin, as illustrated by capacitor 1150. The sense amplifier circuit 1175 is also shown coupled to an optional keeper 1140, which comprises two inverters 1130 and 1140. The sense amplifier circuit 1175 comprises control circuitry 1190, a gated diode amplifier 1100, and an optional output device 1160. The gated diode amplifier 1100 comprises an isolation device 1145 and a gated diode 1130. The optional output device 1160 comprises an inverter having a PFET 1165 and an NFET 1170. In this example, a control terminal of the PFET 1165 is coupled to the control circuitry 1190 through a PFET control line 1182. The control circuitry 1190 creates a PFET control signal, bPC, on the PFET control line 1182. The sense amplifier circuit 1175 is coupled to an output line 1180 and produces an output signal, Vout, on an output line 1180. The control circuitry 1190 is coupled to a control terminal of the isolation device 1145 through an isolation device control line 1181 and is coupled to the set line 1120.

In this example, the control circuitry 1190 creates a sampling signal, SMPL, on the control terminal 1181 and a set signal, SET, on the set line 1120. There is a sensing node 1101 in FIG. 11.

The keeper 1140, made up of two small inverters 1130 and 1140 forming one example of a latch, is optional. The keeper 1140 is used for holding, if needed, the output voltage of the dynamic node, Vout, on the output line 1180 for an indefinite period of time until the output node Vout is precharged again.

An exemplary technique for operating the sense amplifier circuit 1175 is as follows. For a sampling operation, the following signal voltages are created by control circuitry 1190:

SET=bPC=low;
SMPL=high; and
Vout is precharged to high.

The SMPL signal causes the isolation device 1145 to be ON. The small signal, Vi, on signal line 1110 is sampled and stored at the sensing node 1101, Vgd. The sampled small signal is stored even after SMPL goes low, turning OFF the isolation device 1145.

During a sensing operation, the following signal voltages are created by the control circuitry 1190:

SMPL=low;
bPC=high; and
SET goes from low to high to boost Vgd.

If the voltage at the sensing node 1101, Vgd, is low, then the output signal, Vout, stays high. Conversely, if Vgd is high, the NFET 1170 turns ON and discharges the precharged high voltage on the output line 1180 to low, so Vout falls to low. The signals SMPL and SET can be complementary or SMPL can be turned off sooner than SET goes high. The signals bPC and SET can be same signal, if desired.

In general, as described earlier, the magnitude of SET signal can be a predetermined voltage of a digital signal or it can be made adjustable to give the desired voltage boosting needed for the gated diode amplifier.

Figure 12:
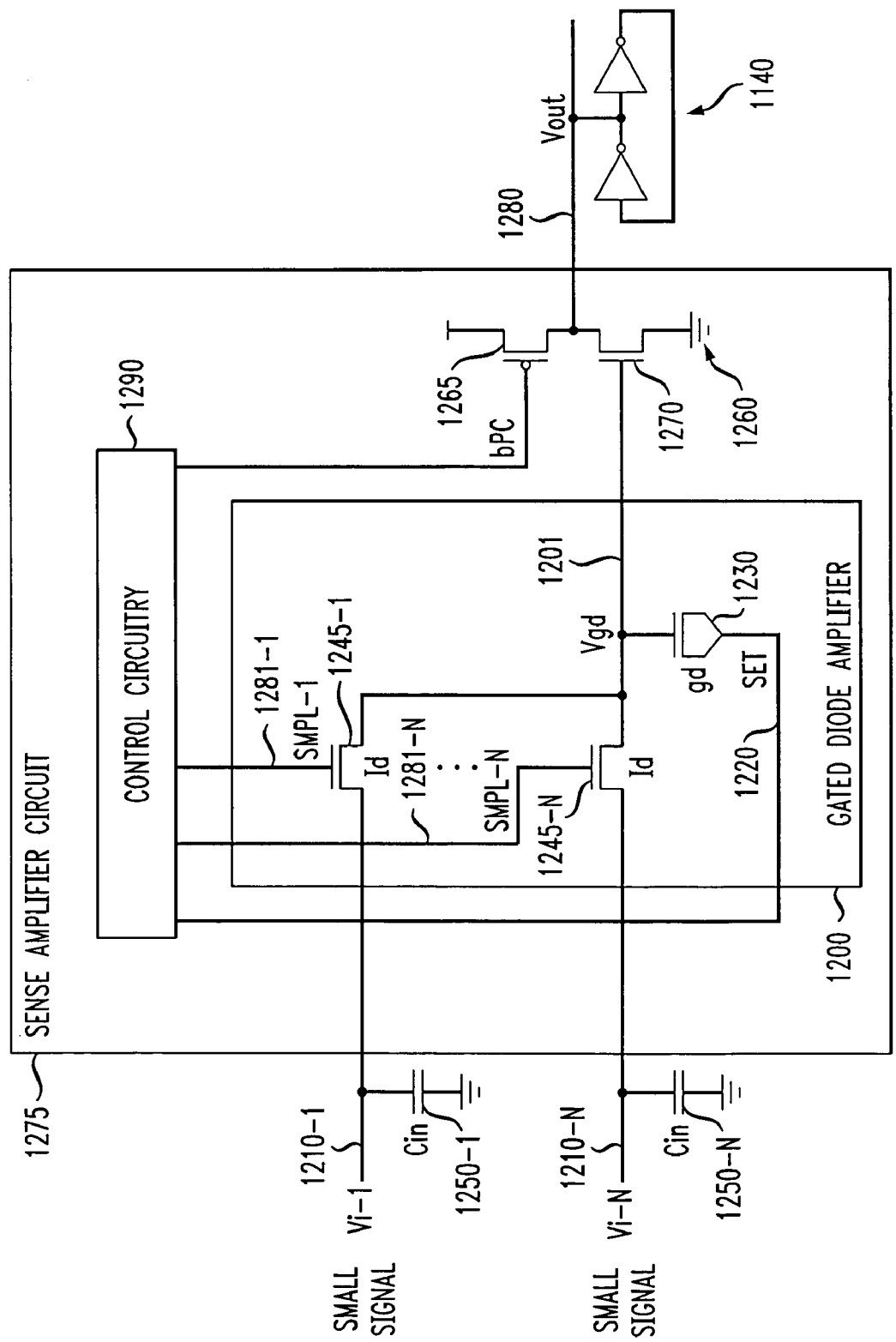
FIGS. 12 and 13 are additional examples of sense amplifier circuits, each of which interfaces with an optional keeper, and uses a gated diode amplifier and control circuitry adapted to control certain elements of the amplifier circuit.

Turning now to FIG. 12, a sense amplifier circuit 1275 is shown. Sense amplifier circuit 1275 is shown coupled to N signal lines 1210-1 through 1210-N, each of which is adapted to carry a small signal, Vi, and has an input capacitance of Cin, as illustrated by capacitors 1250-1 through 1250-N. In general, the N capacitors 1250-1 through 1250-N can be of different capacitance. The sense amplifier circuit 1275 is also shown coupled to an optional keeper 1140, which operates as described in reference to FIG. 1. The sense amplifier circuit 1275 comprises control circuitry 1290, a gated diode amplifier 1200, and an optional output device 1260. The gated diode amplifier 1200 comprises N isolation devices 1245-1 through 1245-N and a gated diode 1230. The optional output device 1260 comprises an inverter having a PFET 1265 and an NFET 1270. In this example, a control terminal of the PFET 1265 is coupled to the control circuitry 1290 through a PFET control line 1282. The control circuitry 1290 creates a PFET control signal, bPC, on the PFET control line 1282. The sense amplifier circuit 1275 is coupled to an output line 1280 and produces an output signal, Vout, on an output line 1280. The control circuitry 1290 is coupled to control terminals of the isolation devices 1245 through isolation device control lines 1281-1 through 1281-N and is coupled to the set line 1220. In this example, the control circuitry 1290 creates sampling signals, SMPL-1 through SAMP-N, on the control terminals 1281 and a set signal, SET, on the set line 1220. There is a sensing node 1201 in FIG. 12.

An exemplary technique for operating the sense amplifier circuit 1275 is as follows. For a sampling operation, the following signal voltages are created by control circuitry 1290:

SET=bPC=low;
SMPLi=high (e.g., a selected one of the N isolation device control lines 1281 is high, the rest are low); and
Vout is precharged to high.

The high voltage on one of the selected isolation device control line 1281 causes a corresponding one of the isolation devices 1245 to be ON. The small signal, Vi, on a corresponding signal line 1210 is sampled and stored at the sensing node 1201, as Vgd. The stored small signal is stored even after SMPLi goes low.

During a sensing operation, the control circuitry 1290 creates the following signal voltages:

SMPLi=low, for i=1, . . . , N (all SMPL=low);
bPC=high; and
SET goes from low to high to boost Vgd.

If the voltage at the sensing node 1201, Vgd, is low, then the output signal, Vout, stays high. Conversely, if Vgd is high, the NFET 1270 turns ON and discharges the precharged high voltage on the output line 1280 to low, so Vout falls to low. The signals SMPLi and SET can be complementary or SMPLi can be turned off sooner than SET goes high. The signals bPC and SET can be same signal, if desired.

In general, as described earlier, the magnitude of SET signal can be a predetermined voltage of a digital signal or it can be made adjustable to give the desired voltage boosting needed for the gated diode amplifier.

Figure 13:
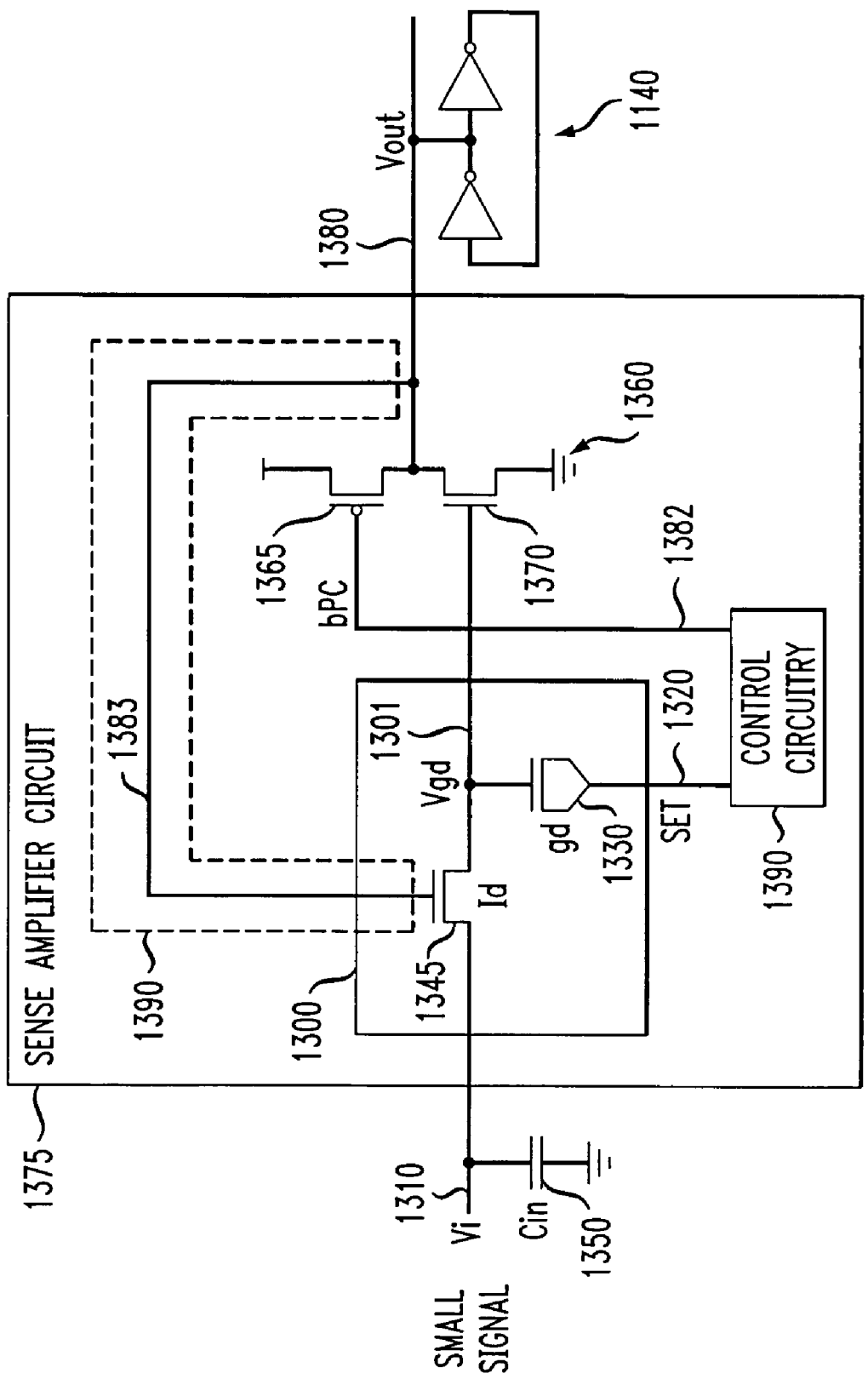

Turning now to FIG. 13, a sense amplifier circuit 1375 is shown. Sense amplifier circuit 1375 is shown coupled to a signal line 1310, which is adapted to carry a small signal, Vi, and has an input capacitance of Cin, as illustrated by capacitor 1350. The sense amplifier circuit 1375 is also shown coupled to an optional keeper 1140, which operates as described in reference to FIG. 11. The sense amplifier circuit 1375 comprises control circuitry 1390, a gated diode amplifier 1300, and an optional output device 1360. The gated diode amplifier 1300 comprises an isolation device 1345 and a gated diode 1330. The optional output device 1360 comprises an inverter having a PFET 1365 and an NFET 1370. In this example, a control terminal of the PFET 1365 is coupled to the control circuitry 1390 through a PFET control line 1382. The control circuitry 1390 comprises isolation device control line 1383. The control circuitry 1390 creates a PFET control signal, bPC, on the PFET control line 1382. The sense amplifier circuit 1375 is coupled to an output line 1380 and produces an output signal, Vout, on an output line 1380. The control circuitry 1390 is coupled to the set line 1320. In this example, the control circuitry 1390 creates a set signal, SET, on the set line 1320. There is a sensing node 1301 in FIG. 13.

An exemplary technique for operating the sense amplifier circuit 1375 is as follows. For a sampling operation, the following signal voltages are created by control circuitry 1390:

SET=bPC=low; and
Vout is precharged to high.

In FIG. 13, the sense amplifier circuit 1375 precharges Vout high by using the control signal bPC. During the sampling operation, the high output of the output signal, Vout, is fed back to the control terminal of the isolation device 1345 through the isolation device control line 1383 so the isolation device 1345 is turned ON, as a result the small signal Vi appears at the sampling node 1301 (e.g., signal Vgd). After pre-charging (bPC=high), the control signal SET is set to high and the gated diode 1330 boosts the voltage at the sampling node 1301 corresponding to data one or data zero, as described above in reference to the gated diode amplifier operation. The boosted voltage in turn would switch the pre-charged output device 1360 accordingly during a sensing operation.

Thus, during the sensing operation, the control circuitry 1390 creates the following voltage signals:
bPC=high; and
SET goes from low to high to boost Vgd.

If Vgd is low, Vout stays high, as the isolation device 1345 remains ON because Vi and Vgd are low. If Vgd is high, Vout falls to low and the isolation device 1345 turns off, as Vout is routed through isolation device control line 1383 to the control terminal of the isolation device 1345. The voltage at node Vout is held constant by using the keeper 1140 until the next precharge operation when SET and bPC go low again. The signals bPC and SET can be the same signal.

In general, as described earlier, the magnitude of SET signal can be a predetermined voltage of a digital signal or it can be made adjustable to give the desired voltage boosting needed for the gated diode amplifier.

Therefore, during the sensing operation, SET=high after being raised. If the small signal corresponds to a data zero, the sampling node 1301, having signal Vgd, remains low and output signal remains high. On the other hand, if the small signal corresponds to a data one, Vgd is boosted high, and the output device 1360 switches the output signal to low and also turns OFF the isolation device (id). The next sampling operation will start a new cycle. In this circuit arrangement, the two control signals bPC and SET can be the same signal, reducing to only a single control signal. The operation is divided into a sampling operation (e.g., bPC=SET=0) and a sensing operation (e.g., SET=1). An optional keeper circuit, such as keeper 1140, may be needed to hold the output voltage of the output line 1380 due to leakage current through the NFET 1370 of the output device 1360.

The feedback connection 1383, from the output node Vout to the control terminal of the isolation device, forms a unique "self-sampling" circuit topology comprising the gated diode amplifier 1300 and an precharged inverter 1360 with precharge signal 1382 such that only one control signal is needed, namely the set signal SET which can be used for the PFET precharge control signal bPC.

Figure 14:
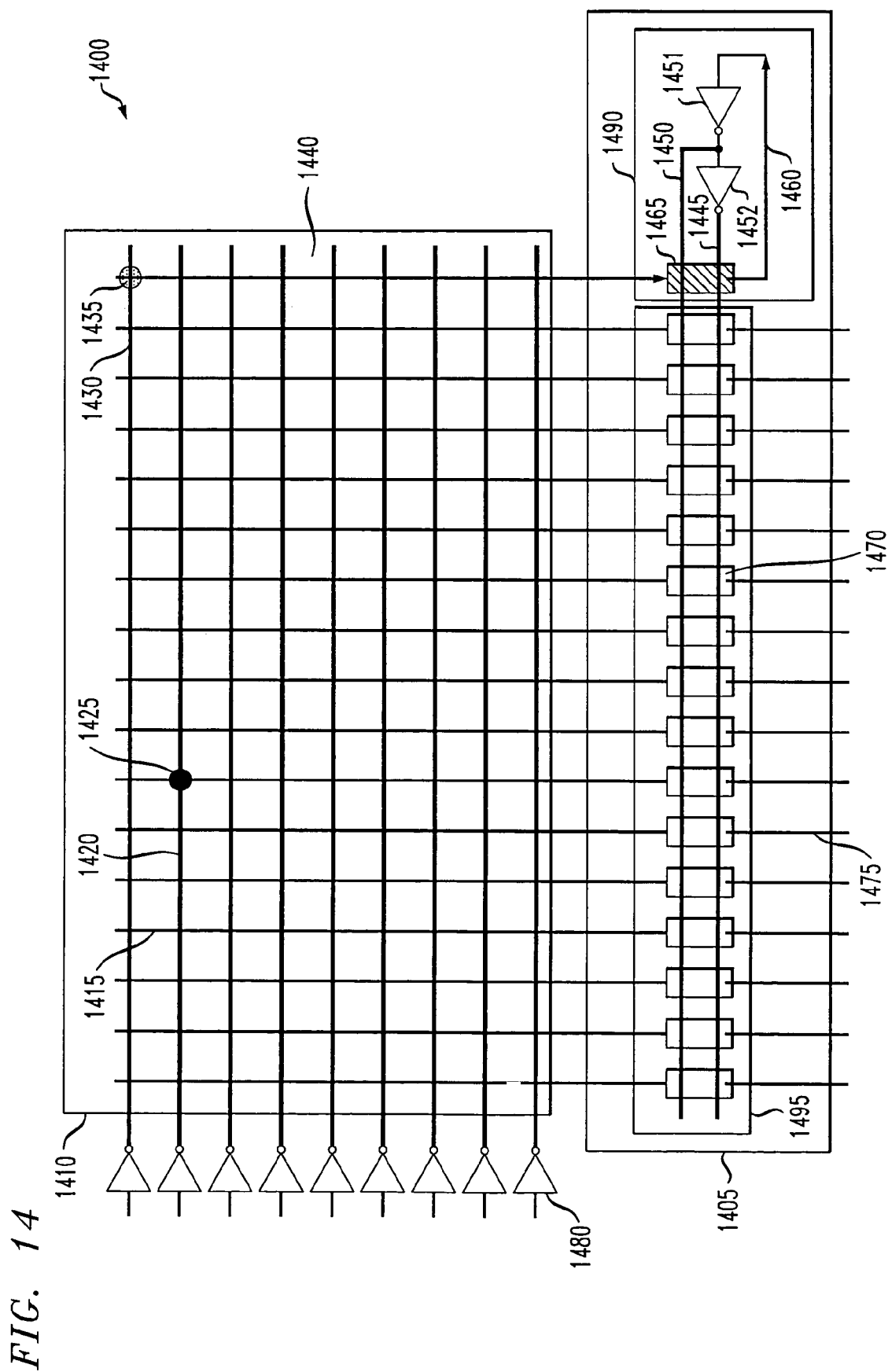
FIG. 14 illustrates an example of a sense amplifier circuit interfacing with a memory array.

Referring now to FIG. 14, a memory 1400 is shown. Memory 1400 comprises a memory array 1410, a number of wordline drivers 1480, and a sensing block 1405. The memory array 1410 comprises a number of bitlines 1415, and a number of wordlines 1420. At the intersection of each bitline 1415 and wordline 1420 is a memory cell 1425. One of the bitlines 1415 is a trigger bitline 1440 and one of the wordlines 1420 is trigger wordline 1430. At the intersection of the trigger bitline 1440 and the trigger wordline 1430 is a trigger memory cell 1435. The sensing block 1405 comprises an array 1495 of gated diode sense amplifiers 1470, and control circuitry 1490. Control circuitry 1490 comprises two inverters 1451 and 1452 to generate the complementary control signals SET and SMPL and a trigger circuit 1465. The control circuitry 1490 is coupled to a set line 1445 and produces a SET signal on the set line 1445. Similarly, the control circuitry 1490 is coupled to an isolation device control line 1450 and produces a SMPL signal on the isolation device control line 1450. The gated diode sense amplifiers 1470 are sense amplifiers such as those previously described (e.g., based on the gated diode amplifier 1000 of FIG. 10). It shall be understood that the use of the control signal SMPL is optional, as in the case when the gated diode sense amplifier of FIG. 13 is used, the isolation device is internally controlled by the sense amplifier output, and so the control signal SMPL is not needed. The trigger circuitry 1465 is used to generate a trigger signal 1460, as described below.

To generate the SET signal, for example for the gated diode sense amplifier shown in FIG. 13; or to generate the SMPL and SET signals for example for the gated diode sense amplifiers shown in FIGS. 10–12, the memory 1400 operates in an exemplary embodiment as follows. There is an extra bitline 1415 that is the trigger bitline 1440 and there is an extra wordline 1420 that is trigger wordline 1430. The trigger memory cell 1435 is at one end of the wordline 1430 from the corresponding wordline driver 1480 and has a known state (e.g., data one or data zero) stored. The extra trigger bitline 1440, wordline 1430, and memory cell 1435 are built into the memory array 1410 to emulate hardware variations due to devices, voltages, processes, and temperature variations. These wordlines, bitlines and memory cells:

take into account worst-case signal delay in bitlines;
take into account worst-case signal delay in wordlines; and
take into account activation and read latency of a memory cell.

Exemplary trigger signaling is as follows: trigger wordline 1430 from low to high to activate the trigger memory cell 1435. If the trigger memory cell 1435 stored a data one, a known state, the trigger bitline 1440, once precharged high, will go low. Exemplary trigger circuitry 1465 can be an inverter or an inverter with adjustable delay. The trigger circuitry 1465 generates an output, Vout, that goes high and that is used by the control circuitry 1490 to generate the SET signal on the set signal line 1445 for the gated diode sense amplifiers 1470. If needed, the control circuitry 1490 can also generate the SMPL signal on the isolation device control line 1450 for the gated diode sense amplifiers 1470.

Figure 15A:
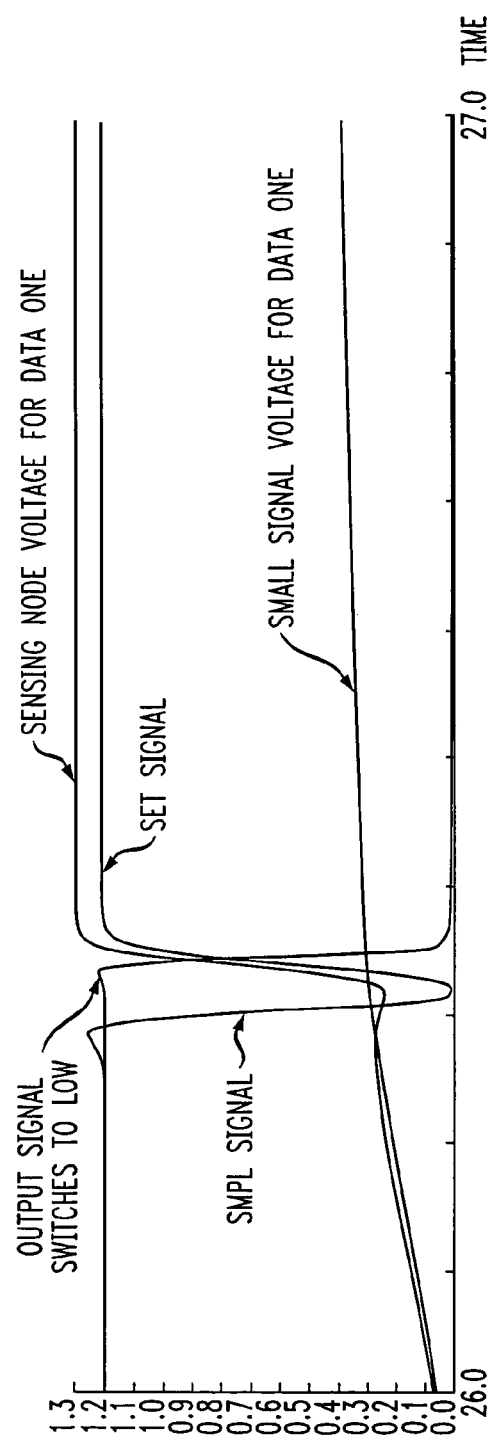
FIGS. 15A and 15B are graphs illustrating waveforms for an exemplary gated diode sense amplifier circuit shown in FIG. 10.
Figure 15B:
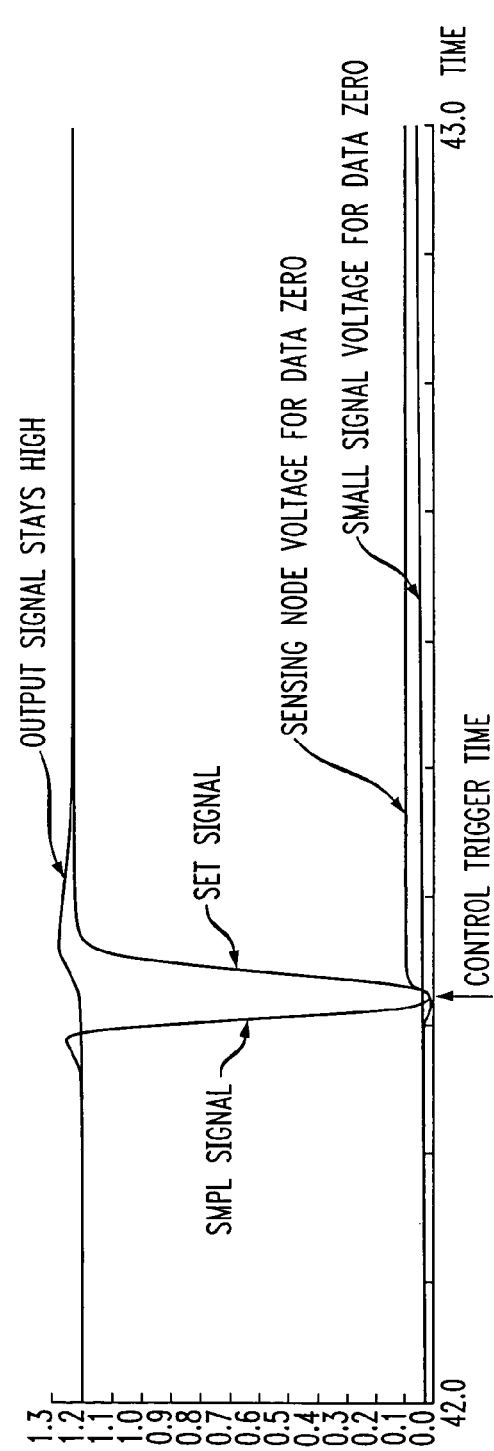

FIGS. 15A and 15B show two graphs of waveforms determined by simulating a gated diode sense amplifier circuit 1075 of FIG. 10. FIG. 15A shows sensing a high voltage for a data one, and FIG. 15B shows sensing a low voltage for a data zero. The voltage waveforms of the voltages for the SMPL signal, SET signal, small input signal, sensing node, and output signal versus time are shown. First, during a sampling operation, the SMPL signal is high to turn on the isolation device, so that the small signal is applied via the isolation device to the gate of the gated diode (e.g., at the sensing node voltage of Vgd). At a certain determined time, the SMPL signal is brought low (e.g., by control circuitry) and the isolation device is therefore turned off. The sampled voltage is stored in the gated diode as Vgd. At about the same time the SMPL signal goes low and the isolation device is turned OFF, the SET signal is triggered to boost the sensing node voltage, Vgd.

In the case of data one (the graph shown in FIG. 15A), the sampled sensing node voltage is around 240 millivolts (mV) (e.g., 20 percent of VDD), and the sensing node voltage is boosted (with the rise of the SET signal) to a high voltage of 1.29V with a supply voltage (VDD) of 1.2V, with a fast rise time of 20 picoseconds (ps). The boosted high voltage at the gates of the PFET and NFET of the output device turns the PFET OFF and the NFET ON and causes the output signal to fall low with a fast fall time. In the case of data zero (the graph shown in FIG. 15B), the sensing node voltage (Vgd) stays low (around 90 mV) when the SET signal is triggered. The output signal of the output device stays high. The voltage gain achieved is (1.29−0.09)/(0.24−0)=5. The data zero or data one output signal can then be stored or passed to subsequent logic stages.

After the sensing operation, the SET signal is driven low and the SMPL signal is driven high to complete the sampling and sensing operations. The driving of the SET signal low and the SMPL signal high is not shown in FIG. 15A or 15B. Even under heavy input line loading, the sense amplifier circuit achieves very fast switching time, such as 20 ps as shown, since loading of the gated diode can be limited to a very small load equivalent to about the loading of minimum feature size.

Figure 16A:
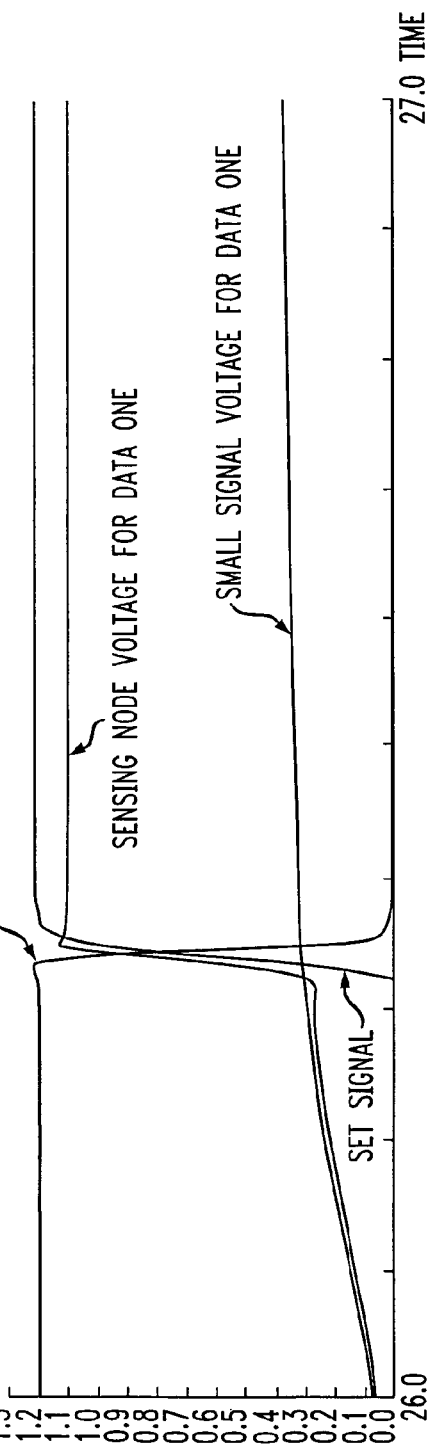
FIGS. 16A and 16B are graphs illustrating waveforms for another exemplary gated diode sense amplifier circuit shown in FIG. 13.
Figure 16B:
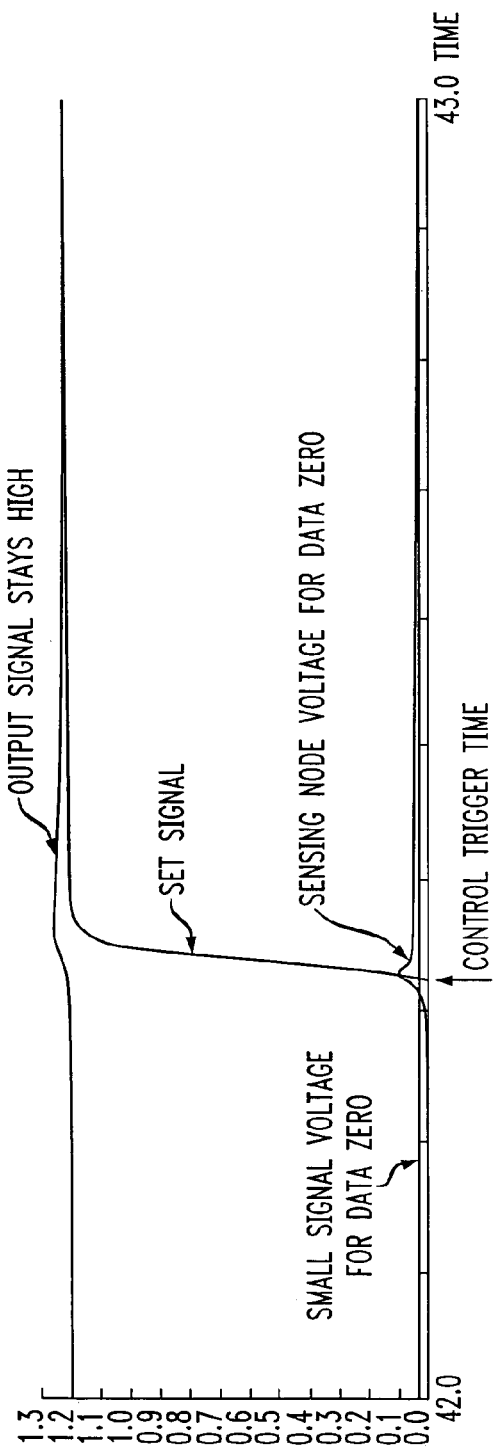

Turning now to FIGS. 16A and 16B, these figures show two graphs of waveforms determined by simulating a gated diode sense amplifier circuit 1375 of FIG. 13. FIG. 16A shows sensing a high voltage for a data one, and FIG. 16B shows sensing a low voltage for a data zero. The voltage waveforms of the voltages for the SET signal, small input signal, sensing node, and output signal versus time are shown. There is no SMPL control signal in this case, and SET is used for bPC also. So, there is only one control signal. First, during a sampling operation, the bPC signal, which is the same as the SET control signal, is low to turn on the PFET of the output device (see FIG. 13). The output signal is precharged high and so the isolation device is ON as the output voltage is fed back to the control terminal of the isolation device. The small signal is applied via the isolation device to the gate of the gated diode (e.g., at the sensing node voltage of Vgd). The sampled voltage appears in the gated diode as Vgd. At a certain determined time, the SET signal is triggered to high to boost the sensing node voltage, Vgd, by the gated diode.

In the case of data one (the graph shown in FIG. 16A), the sampled sensing node voltage is around 240 mV (e.g., 20 percent of VDD), and the sensing node voltage is boosted (by the rise in the SET signal) to a high voltage of about 1.1V with a supply voltage (VDD) of 1.2V, with a fast rise time of 20 picoseconds (ps). The boosted high voltage (Vgd) at the gates of the NFET of the output device turns the NFET ON and causes the output signal to fall low with a fast fall time. The isolation device is then turned OFF as its control terminal voltage is low. In the case of data zero (the graph shown in FIG. 16B), the sensing node voltage (Vgd) stays at almost zero volts after the SET signal is triggered high. The output signal of the output device stays high. The voltage gain achieved is (1.1−0.0)/(0.24−0)=4.6. The data zero or data one output signal can then be stored or passed to subsequent logic stages.

After the sensing operation, the SET signal is driven low to complete the sampling and sensing operations. The driving of the SET signal low is not shown in FIG. 16A or 16B.

Figure 17A:
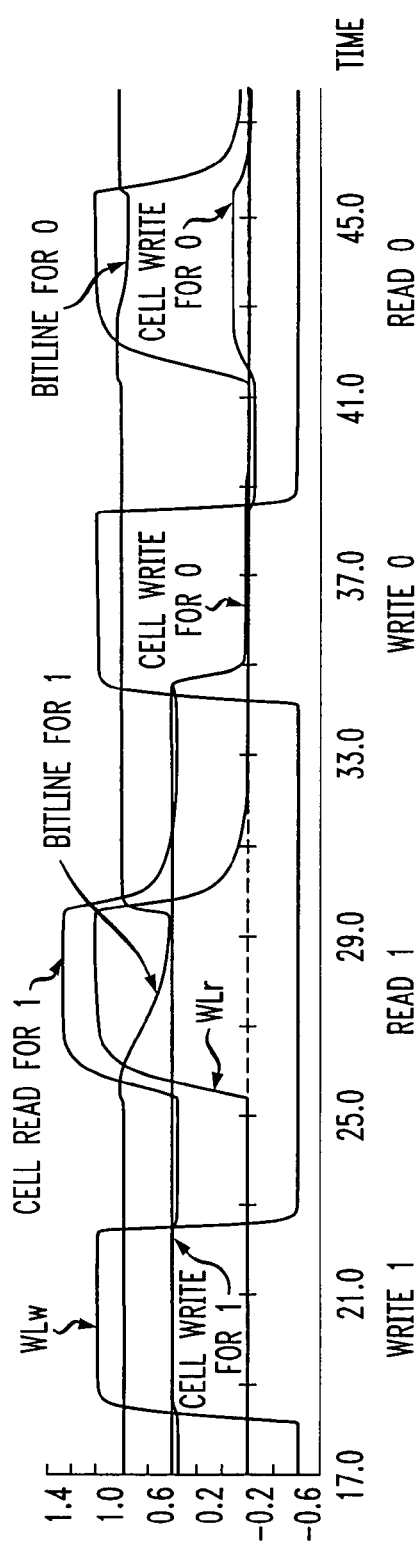
FIGS. 17A, 17B, and 17C are graphs illustrating waveforms for a memory cell for a memory array and for operation of two types of sense amplifier circuits in the memory array.
Figure 17B:
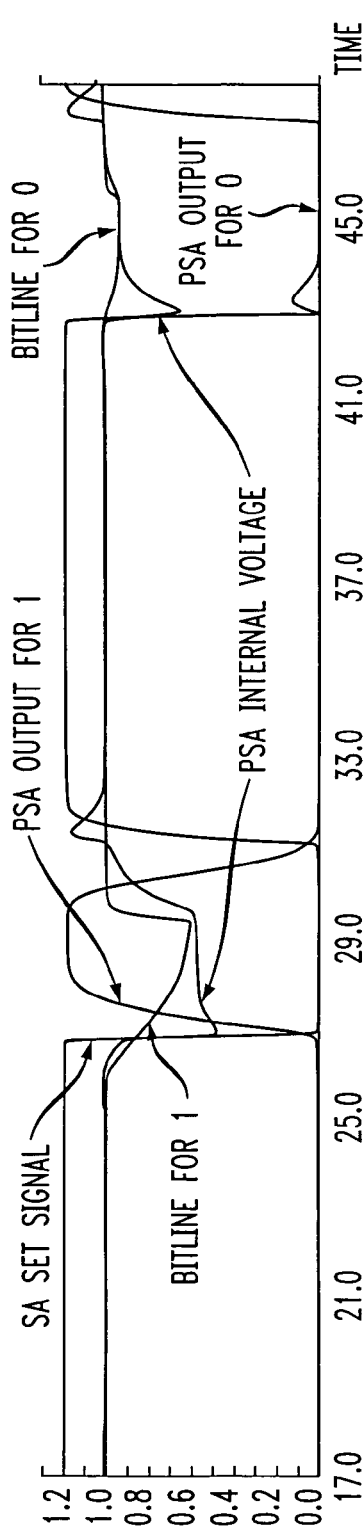
Figure 17C:
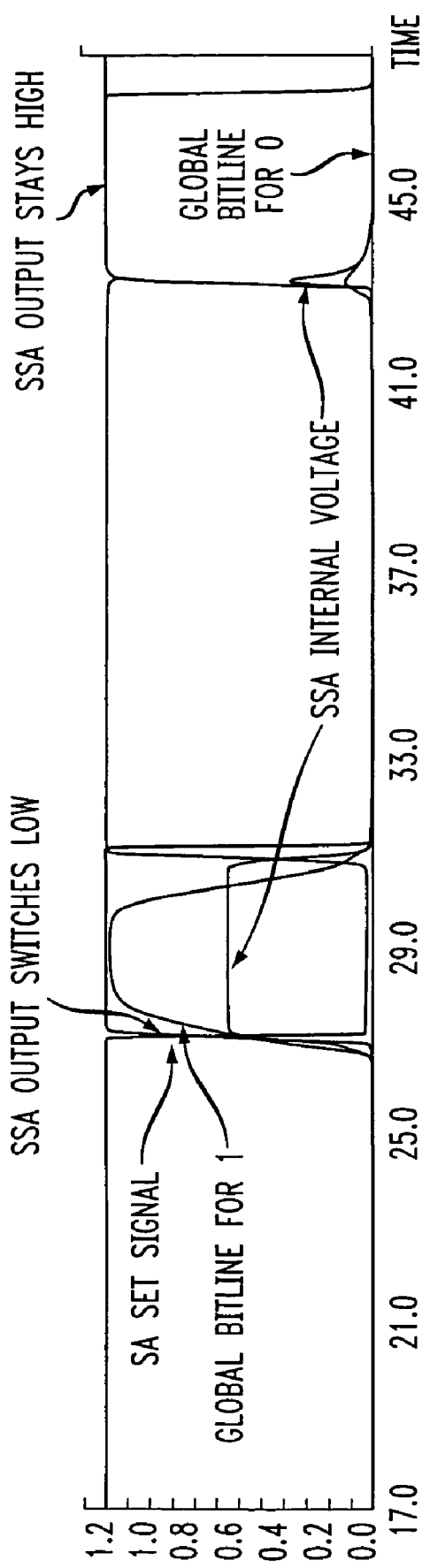

Referring now to FIGS. 17A through 17C, these figures show a number of waveforms for a memory, such as memory 1700 of FIG. 17. In the examples of FIGS. 17A through 17C, the memory has two wordlines, WLw and WLr (e.g., wordlines 1415 of FIG. 14), coupled to each memory cell (e.g., memory cells 1425 of FIG. 14). WLw is a wordline used for writing information into a memory cell, while WLr is a wordline used to read information from a memory cell. Both of these wordlines are coupled to the set line of a memory cell. FIG. 17B shows a Primary Sense Amplifier (PSA) using one of the gated diode sense amplifier circuits described above, and FIG. 17C shows a Secondary Sense Amplifier (SSA) using one of the sense amplifier circuits described above. In FIGS. 17A through 17C, a "1" means that a "data one" is being accessed and a "0" indicates that a data zero is being accessed.

In FIG. 17A, a memory cell is written by driving the WLw signal high, which stores (in the gated diode) a voltage of about 0.6 volts. The memory cell is read by driving the WLr signal high. The "cell read for 1" indicates what the internal voltage for the memory cell is during a read of a data one. Similarly, the "cell write for 0" indicates what the internal voltage for the memory cell is during a write of a data zero. FIG. 17A also shows a memory cell write cycle for a data zero and a memory cell read cycle for a data zero.

FIG. 17B shows the SET signal for a gated diode sense amplifier circuit of a PSA. The PSA output (e.g., the output signal of the sense amplifier circuit) goes high as the SET signal goes low. In this example, the PSA has an input signal of the signal on the bitline. The PSA internal voltage, which is the voltage at the sensing node of a gated diode sense amplifier, is shown for a read of a data one and a read of a data zero. The PSA has an output signal of a global bitline.

FIG. 17C shows a Secondary Sense Amplifier (SSA) that has an input signal of the voltage of the global bitline. The SSA internal voltage, which is the voltage at the sensing node of a gated diode sense amplifier, is shown for a read of a data one and a read of a data zero. The output of the SSA is also shown.

The gated diode sense amplifier circuits described above are designed and operate in a way that the isolation device can be controlled digitally, without the need to set Vc precisely to certain value depending on Vt of the isolation device and the small signal magnitude. As a result, the gated diode sense amplifier circuits become more robust and tolerant to Vt variation, voltage, temperature and process variation. The isolation device operates digitally to control the signal flow of the small signal into the gated diode amplifier.

Sense Amplifier Latch Circuits

In another aspect of the present invention, latch circuits with built-in sense amplifiers are described. These latch circuits can achieve the characteristics of high performance, high data throughput, low power dissipation, and resiliency to variations in the fabrication process sequence. These characteristics are becoming increasingly difficult to achieve as silicon CMOS technology advances. The sense amplifier latch circuits described herein can be used to efficiently detect slow-moving outputs of logic, memory, or long bus lines. In addition to improved operation, these latch circuits are much simpler to design than existing circuits that accomplish similar functions.

By adding an appropriate precharge device and clock inputs to the sense amplifier circuits described above, the resulting circuit can operate as a latch. The clocked nature of the latch circuit allows for a pipelined architecture within the sense amplifier circuit, which maximizes data throughput. The sense amplifier latch circuits herein can be considered, for instance, to be dynamic latches that can provide signal amplification and improved data rates. In addition, the sense amplifier latch circuits can be designed to be extremely insensitive to process variations. The sense amplifier latch circuits are applicable to any FET-based device technology that can provide transistor switches and a two terminal semiconductor device having a non-linear capacitance.

Figure 18:
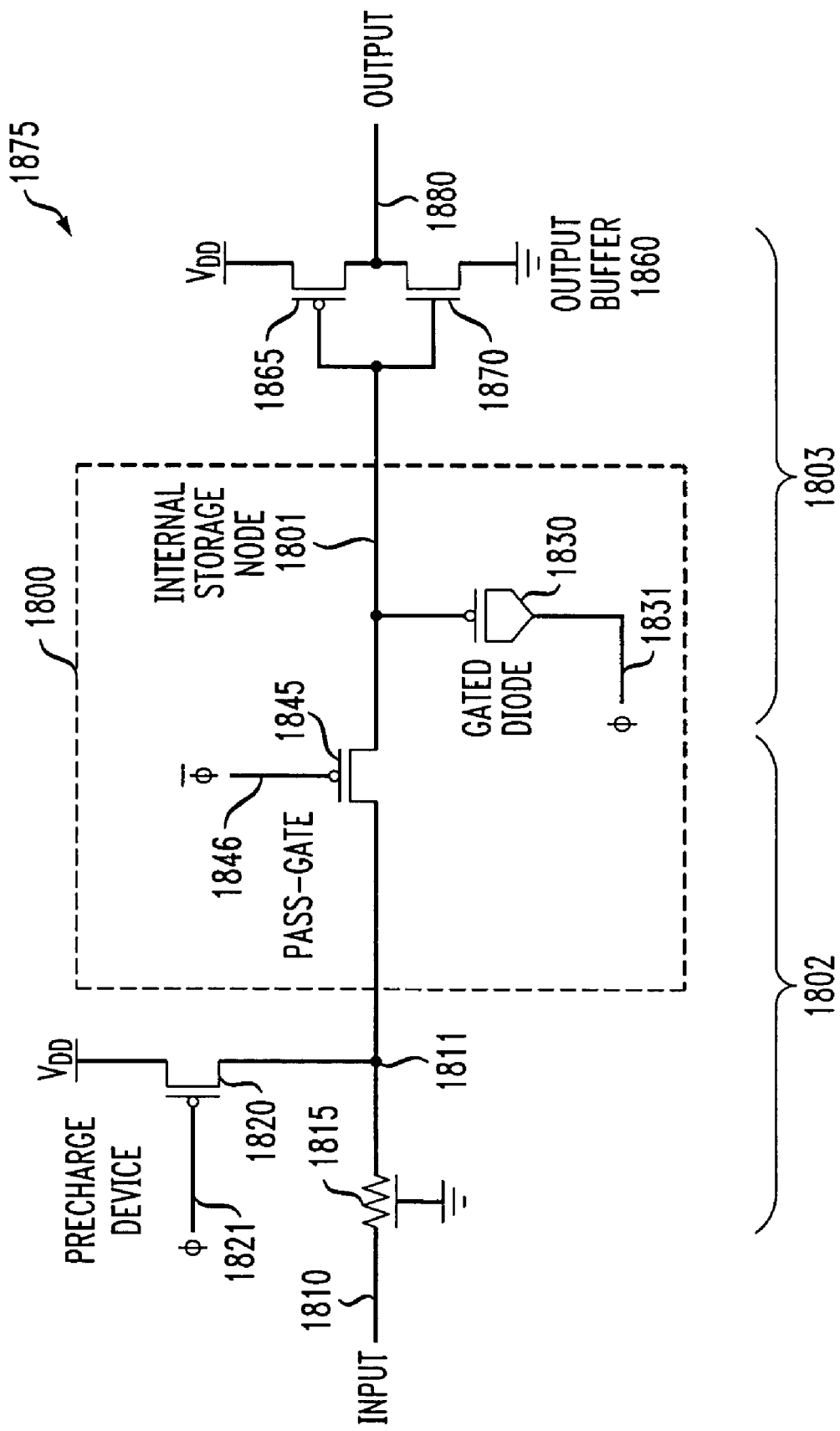
FIG. 18 is an example of a sense amplifier latch circuit.

FIG. 18 shows an example of a sense amplifier latch circuit 1875. Sense amplifier latch circuit 1875 comprises a precharge device 1820, a gated diode sense amplifier 1800, and an output buffer 1860. The gated diode amplifier 1800 comprises a pass-gate 1845 and a gated diode 1830. The output buffer 1860 comprises a PFET 1865 and an NFET

1870. The sense amplifier latch circuit 1875 is coupled to an input 1810 (e.g., a signal line) and produces an output 1880. RC delay element 1815 is an exemplary element indicating that the input 1810 is a slow moving signal that needs amplification.

In FIG. 18, the sense amplifier latch circuit 1875 can be used to sense a signal on the input 1810 as the signal falls from the power supply voltage, VDD, toward a zero potential. The pass-gate 1845 is a switch that is used to control dataflow. The gated diode 1830 is a device used to perform signal amplification. A precharge switch, the precharge device 1820, is used to control the input signal on input 1810. The PFET 1865 and NFET 1870 are used to build the output buffer 1860 (e.g., an inverter) used to drive a signal onto the output 1880, which will have some output load (not shown). Depending on the desired output, the output buffer 1860 could be replaced by more complex logic gates (e.g., NAND or NOR) to build more functionality into the sense amplifier latch circuit 1875 at minimal cost.

Clock inputs 1821, 1846, and 1831 are shown. Clock input 1831 is shown in figures above as being a SET line. Clock inputs 1821 and 1831 are control inputs and are connected to the reference clock, $\phi$. Clock input 1846 is a control input and is connected to the opposite phase of the reference clock, $\bar{\phi}$.

Figure 19:
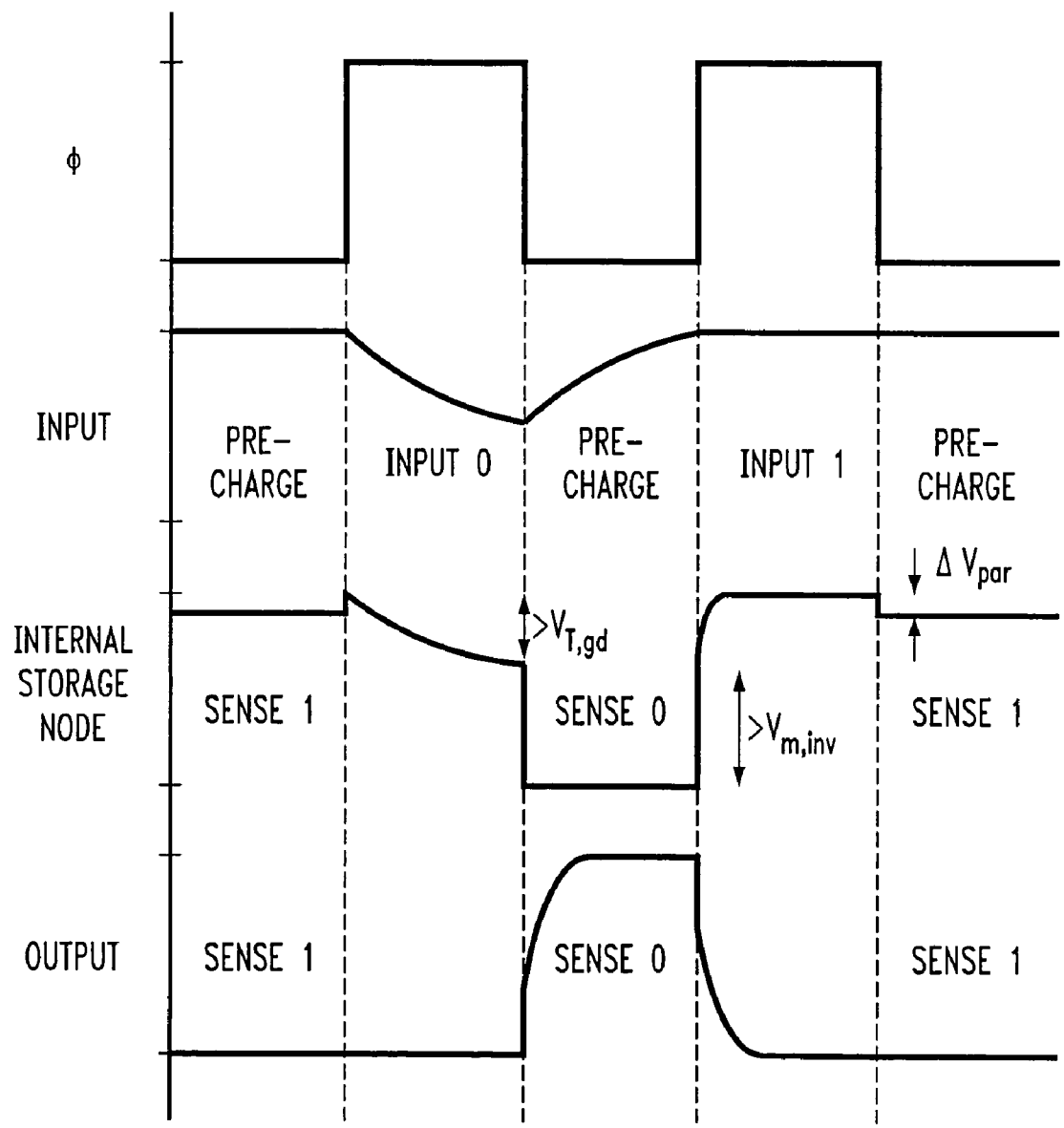
FIG. 19 is an exemplary voltage waveforms for the sense amplifier latch circuit of FIG. 18.

Voltage waveforms that describe an exemplary operation of the sense amplifier latch circuit 1875 from FIG. 18 are shown in FIG. 19. As shown in FIG. 19 (with appropriate reference to FIG. 18), when the reference clock, $\phi$, is low, the precharge device 1820 is used to pull the input node 1811 to $V_{DD}$. During this time, the opposite phase of the reference clock, $\bar{\phi}$, keeps the pass-gate device 1846 off to allow for precharging of the input node 1811. The internal storage node 1801 can be initialized to $V_{DD}$ by passing through the precharge voltage from a previous clock cycle. The source (e.g., and drain, if the source and drain are coupled together) of the gated diode device 1831 is low (as the clock input 831 is tied to $\phi$), which places the gated diode 1830 in the low capacitance state (e.g., only parasitic capacitances exist) because the channel in the gated diode 1830 is not inverted.

When the reference clock rises to the high state, the precharge device 1820 turns off while the pass-gate 1845 turns on. If the signal on input 1810 pulls the voltage on the input 1810 down toward zero potential, the internal storage node 1801 voltage of the sense amplifier 1800 will begin to drop. Because the source of the gated diode 1830 is now at a high voltage, the channel of the gated diode 1830 will become inverted as soon as the voltage at the internal storage node 1801 drops below $V_{DD}-|V_{Tp,gd}|$, where $V_{Tp,gd}$ is the threshold voltage of the gated diode 1830. This places the gated diode 1830 in a high capacitance state. If the signal on input 1810 remains at $V_{DD}$, the internal storage node 1801 voltage will similarly remain at $V_{DD}$, and the gated diode 1830 will remain in the low capacitance state.

When the reference clock falls again to the low state, the source of the gated diode 1830 will also fall to zero potential. The pass-gate 1845 is turned off, which isolates the internal storage node 1801 of the sense amplifier 1800 such that no charge can be brought into or out of this node 1801. During this switching event, capacitive coupling between the two terminals (e.g., the gate coupled to internal storage node 1801 and the source coupled to the clock input 1831) of the gated diode 1830 will result in a drop in the potential of the internal storage node 1801. If the gated diode 1830 was in the high capacitance state (i.e., data during the previous clock cycle was low), charge neutrality dictates that the internal storage node 1801 voltage will drop by a large amount. The exact value may be determined by the relative capacitance of the gated diode 1830 to the total capacitance of the internal storage node 1801. This change in potential can be designed to switch the output buffer 1860 (if the voltage at the internal storage node 1801 falls below $V_{m,inv}$, the switching point of the buffer 1860), and a full-swing output voltage is obtained as the voltage on the output 1880 switches to $V_{DD}$.

If the gated diode 1830 was in the low capacitance state (i.e., data during the previous cycle of the reference clock was high), capacitive coupling will be small—due only to parasitic elements—and the internal storage node 1801 voltage will stay close to VDD (the voltage falls by only a small amount, $\Delta V_{par}$) when the source of the gated diode 1830 is pulled low. The output buffer 1860 therefore does not switch and an output voltage of zero is maintained on the output 1880. As such, this sense amplifier latch circuit 1875 outputs the logical complement of the input logic state. The input logic state can always be reconstructed by feeding the output 1880 of the buffer 1860 into an additional inverting stage.

While the gated diode 1830 is evaluating the input data from the previous high voltage of the reference clock, the first part 1802 (e.g., the part of the circuit 1875 up to the pass gate 1845 and including the precharge device 1820) of the circuit 1875 is again in the precharge state since $\phi=0$. When the reference clock switches high again, the first part 1802 of the circuit evaluates while the second part 1803 (e.g., the part of the circuit from the pass gate 1845 through the output 1880) of the circuit 1875 performs an effective "precharge" operation by bringing the voltage of the internal storage node 1801 back to a value large enough to switch the output buffer 1860. Since there is likely a large capacitance on the input node 1811, charge sharing would allow the pass-gate 1845 to bring the potential of the internal storage node 1801 back to nearly $V_{DD}$. As a result, a pipelined architecture is achieved within the sense amplifier latch circuit 1875 as the two adjacent parts 1802 and 1803 of the circuit 1875 can simultaneously be in precharge and evaluate periods and vice versa. A similar sense amplifier latch circuit operated with the opposite clock phase (e.g., replacing $\phi$ with $\bar{\phi}$ and $\bar{\phi}$ with $\phi$) can be placed in parallel with this sense amplifier latch circuit 1875, thus allowing data to be sensed and obtained during both phases of the reference clock, thereby effectively doubling the data rate if the outputs of the two latches are multiplexed together. Data can thus be transferred at twice the reference clock frequency.

For illustration purposes, the circuit 1875 in FIG. 18 is drawn using PFETs for the precharge device 1820, pass-gate 1845, and gated diode 1830. However, it is straightforward to design this circuit 1875 using instead NFET precharge devices 1820, pass-gates 1845, and gated diodes 1830. In such a case, the polarity of the clock signals would be reversed.

In the circuit diagram shown in FIG. 18, both phases of the reference clock are required (clock, $\phi$, and its complement, $\bar{\phi}$). It might desirable, however, to use a single-phase clock design ($\phi$ only), thus eliminating the need to route two separate clock phases. This ensures that there are no timing problems due to skew between the two clock phases. Two such variations of the circuit shown in FIG. 18 are presented in FIGS. 20 and 21.

Figure 20:
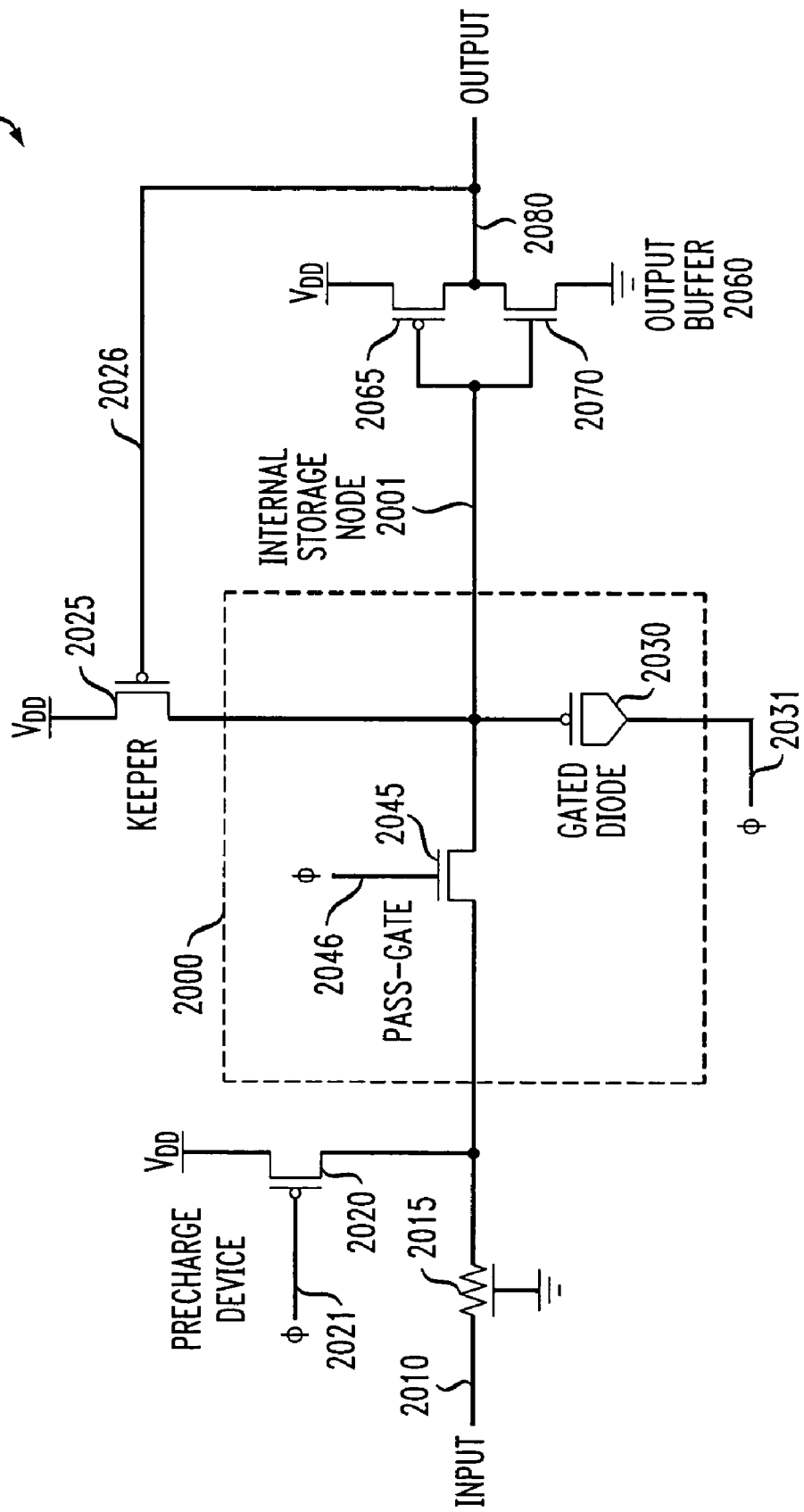
FIGS. 20–23 are additional examples of sense amplifier latch circuits.

FIG. 20 shows an example of a sense amplifier latch circuit 2075. Sense amplifier latch circuit 2075 comprises a precharge device 2020, a gated diode amplifier 2000, an output buffer 2060, and keeper 2025. The gated diode amplifier 2000 comprises a pass-gate 2045 and a gated diode

2030. The output buffer 2060 comprises a PFET 2065 and an NFET 2070. The sense amplifier latch circuit 2075 is coupled to an input 2010 and produces an output 2080. RC delay element 2015 is an exemplary element indicating that the input 2010 is a slow moving signal that needs amplification. Clock inputs 2021, 2031, and 2046 are control inputs and are coupled to the reference clock, $\phi$, which will typically be coupled to control circuitry, as described above.

In FIG. 20, an NFET pass-gate 2045 is used to isolate the internal storage node 2001 from the input 2010. Because an NFET is used, the reference clock can be directly tied to the gate of the pass-gate 2045 without inversion. However, since an NFET might not be able to pull the internal storage node 2001 all the way up to the power supply voltage, $V_{DD}$, a PFET keeper 2025 would likely need to be used. The PFET keeper 2025 has a control input 2026 coupled to the output 2080.

Figure 21:
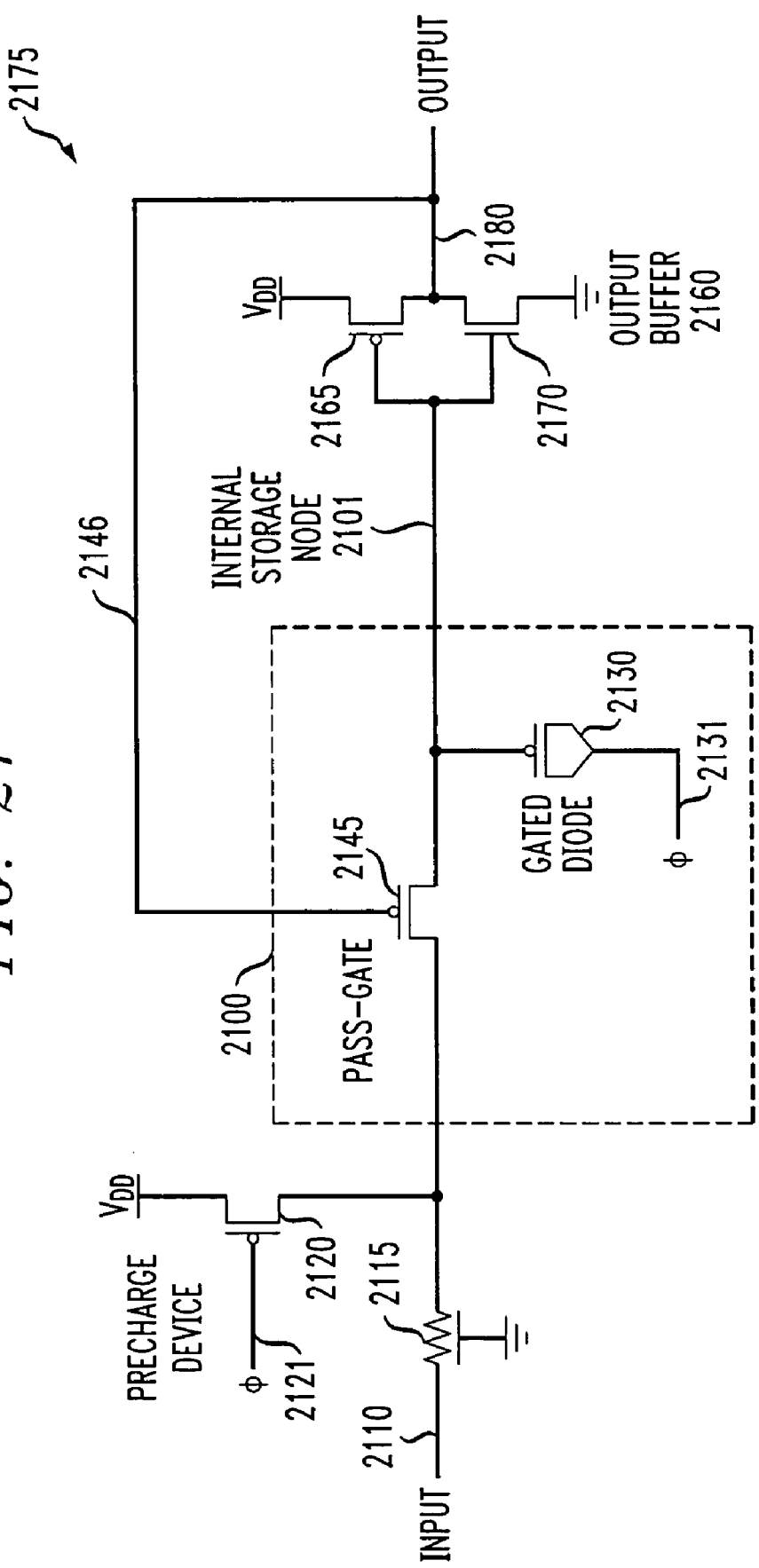

In FIG. 21, the sense amplifier latch circuit 2175 comprises a precharge device 2120, a gated diode amplifier 2100, and an output buffer 2160. The gated diode amplifier 2100 comprises a pass-gate 2145 and a gated diode 2130. The output buffer 2160 comprises a PFET 2165 and an NFET 2170. The sense amplifier latch circuit 2175 is coupled to an input 2110 and produces an output 2180. RC delay element 2115 is an exemplary element indicating that the input 2110 is a slow moving signal that needs amplification. Clock inputs 2121 and 2131 are control inputs and are coupled to the reference clock, $\phi$, which will typically be coupled to control circuitry as described above. The control input 2146 for the pass-gate 2145 is coupled to the output 2180.

In FIG. 21, the PFET pass-gate 2145 is retained, but the control signal 2146 applied to the gate of the PFET pass-gate 2145 is the output 2180. The only situation in which the pass-gate 2145 is switched off is when the voltage on the output 2180 changes (e.g., the gated diode 2130 pulls the internal storage node 2101 low). This allows for isolation of the internal storage node 2101 from the input 2110, which is precharging during the evaluation of the gated diode amplifier 2100. In addition, when the internal storage node 2101 is high, the pass-gate 2145 is turned on, which helps to stabilize the value of the internal storage node 2101.

The circuit 2175 depicted in FIG. 21 is attractive, as compared to the circuit 2075 of FIG. 20, because the circuit 2175 minimizes the number of transistors needed to build the circuit 2175. Furthermore, the circuit 2175 does not require that the input 2110 and pass-gate 2145 operate to pull down the internal storage node 2101 (e.g., or 2001) as the keeper 2025 (see FIG. 20) attempts to pull up the internal storage node 2101 (e.g., or 2001), as would occur if the keeper 2025 were used. This contention for the internal storage node 2010 (e.g., or 2001) could increase delay and power dissipation.

However, when power is initially applied to the circuit 2175, it is possible that the circuit 2175 could be stuck in a state from which the circuit 2175 cannot recover (which is not true of the circuit 2075 of FIG. 20). For example, if the internal storage node 2101 starts off at zero voltage and the clock at VDD, the output will never drop to zero. Capacitive coupling from the gated diode 2130 will simply drive the internal storage node 2101 to a negative voltage, thus never flipping the output buffer 2160. Thus, the pass-gate 2145 will never turn on, and the internal storage node 2101 will never get precharged. This problem may very well be mitigated by subthreshold or gate leakage currents that may charge up the internal storage node 2101 over time, but to ensure that this problem is completely eliminated, circuits as shown in FIGS. 22 and 23 may be used.

Figure 22:
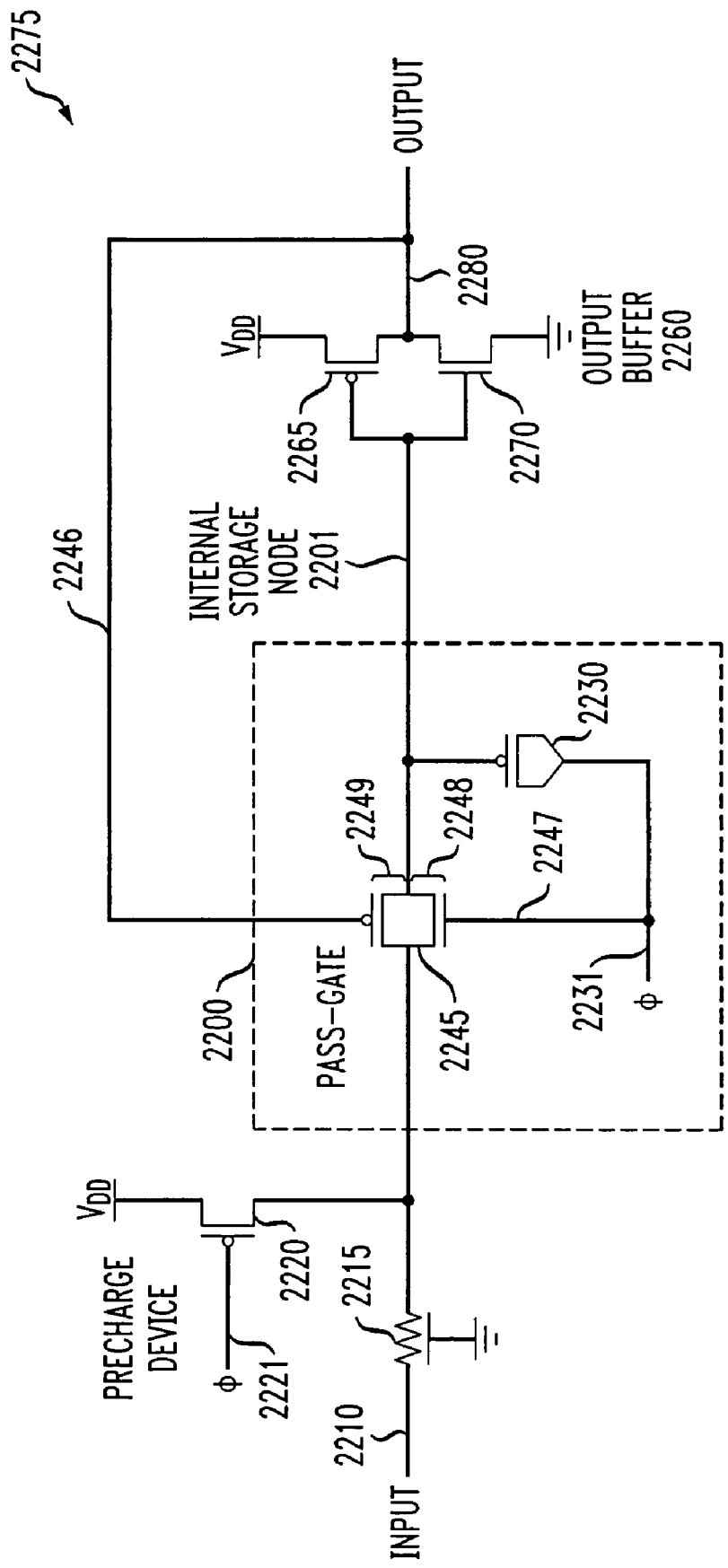

In FIG. 22, the sense amplifier latch circuit 2275 comprises a precharge device 2220, a gated diode amplifier 2200, and an output buffer 2260. The gated diode amplifier 2200 comprises a pass-gate 2245 and a gated diode 2230. The output buffer 2260 comprises a PFET 2265 and an NFET 2270. The sense amplifier latch circuit 2275 is coupled to an input 2210 and produces an output 2280. RC delay element 2215 is an exemplary element indicating that the input 2210 is a slow moving signal that needs amplification. Clock inputs 2221 and 2231 are control inputs and are coupled to the reference clock, $\phi$, which is typically coupled to control circuitry as described above. One control input 2246 for the pass-gate 2245 is coupled to the output 2280 and another control input 2247 for the pass-gate 2245 is coupled to the reference clock.

FIG. 22 thus adds a pass-gate 2245 made of an NFET portion 2248 in parallel with a PFET portion 2249—effectively combining the two circuits shown in FIGS. 20 and 21. The NFET portion 2248 is useful in ensuring initialization, as the NFET portion 2248 will allow for precharging of the internal storage node. Due to the threshold voltage drop required to turn on the NFET portion 2248 of the pass-gate 2245, the NFET portion 2248 does not contribute significantly to the switching performance of the latch.

Figure 23:
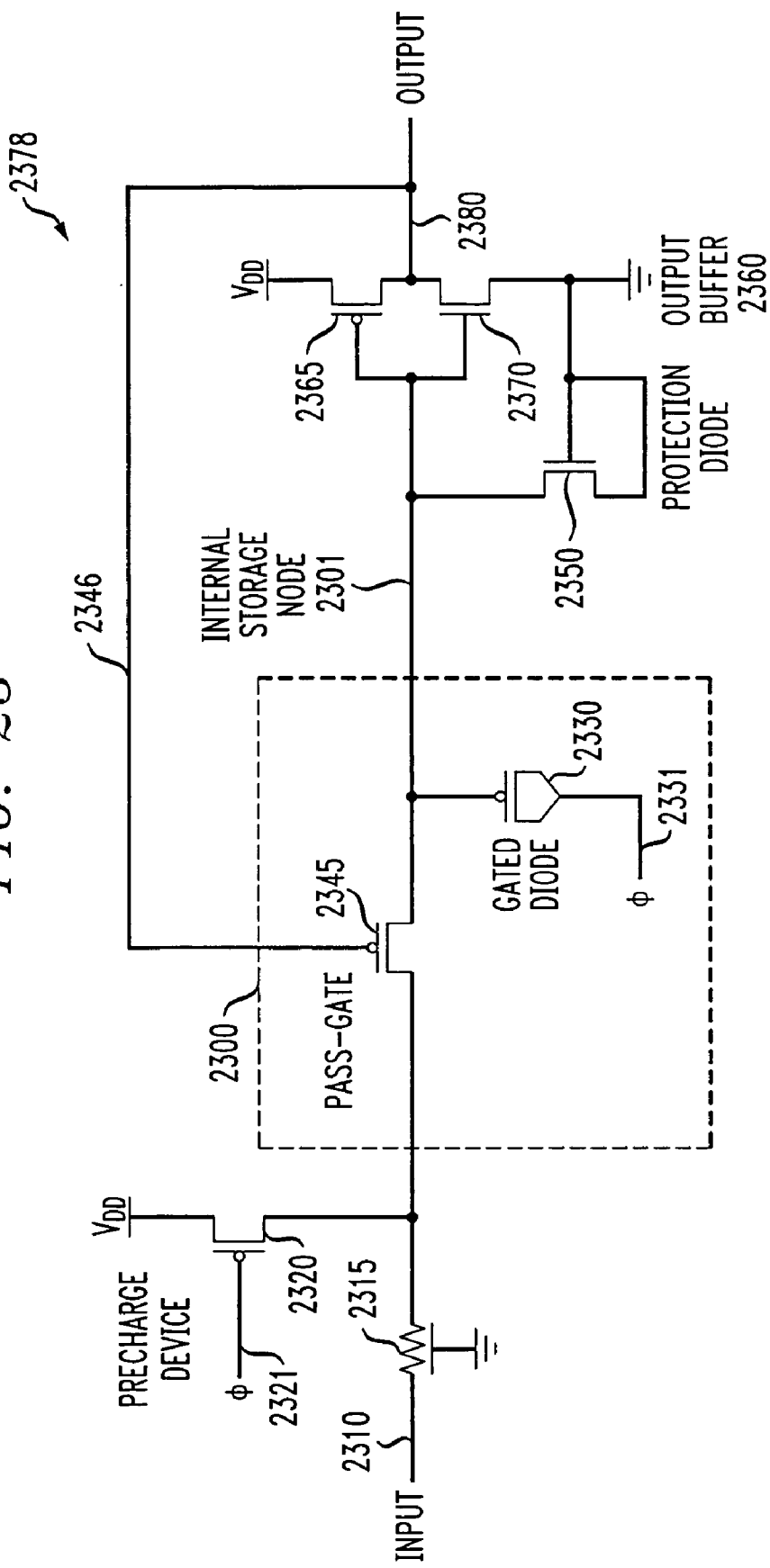

In FIG. 23, the sense amplifier latch circuit 2375 comprises a precharge device 2320, a gated diode amplifier 2300, an output buffer 2360, and a MOS protection diode 2350. The gated diode amplifier 2300 comprises a pass-gate 2345 and a gated diode 2330. The output buffer 2360 comprises a PFET 2365 and an NFET 2370. The sense amplifier latch circuit 2375 is coupled to an input 2310 and produces an output 2380. RC delay element 2315 is an exemplary element indicating that the input 2310 is a slow moving signal that needs amplification. Clock inputs 2321 and 2331 are control inputs and are coupled to the reference clock, $\phi$, which is typically coupled to control circuitry as described above. A control input 2346 for the pass-gate 2345 is coupled to the output 2380.

FIG. 23 adds a MOS protection diode 2350 that prevents the internal storage node 2301 from reaching a significant negative potential by supplying charge to the internal storage node 2301. The charge ensures that when the reference clock switches high, capacitive coupling will push the internal storage node 2301 far enough to switch the voltage on the output 2380 to low, thus turning on the pass-gate 2345 and allowing the precharge voltage to reach the internal storage node 2301.

Improved Gated Diode Structure for Low Vt, Low Vt Fluctuation and Low Parasitic Capacitance As CMOS technologies have scaled, the impact of manufacturing process variations on device threshold voltages has become magnified. This is especially important in conventional latch and sense amplifier circuits, which often rely upon cross-coupled inverters with matched threshold voltages for the switches making up the cross-coupled inverters. The sense amplifier circuit and sense amplifier latch circuits proposed herein are dynamic circuits based upon charge storage and sense amplifiers based upon a gated diode, so that precise threshold voltage control and matching is typically not required for proper circuit operation. In addition, the critical devices in these sense amplifier circuits and sense amplifier latch circuits can be designed to minimize threshold voltage fluctuation without jeopardizing performance.

In the sense amplifier circuits and sense amplifier latch circuits described above, the switching or latching point for a small signal applied at the input is determined at least by the threshold voltage of the gated diode (e.g., $V_{T,gd}$). While the sense amplifier circuits and sense amplifier latch circuits will still function if the threshold voltage of the gated diode parameter fluctuates, it is still desirable to minimize variation. Since the gated diode is not used to provide current drive, a large channel length, L, can be used. This substantially eliminates threshold voltage variation due to gate length, critical dimension control, and the short-channel effect, as long as the length is not too large such that carrier transit time across the channel becomes significant. Similarly, channel width critical dimension control and the narrow-width effect can be avoided by designing a large device width, W. Both of these are also desirable to obtain a large capacitance on the gated diode to maximize capacitive coupling to the internal storage node during sensing. Furthermore, a low value of $V_{T,gd}$ is desirable because the voltage change, at the input, that is to be sensed will likely be small. This means that low dose ion implantation will likely be used for the gated diode, which results in a lower background doping concentration, and thus reduced susceptibility to random dopant fluctuation and gate oxide thickness variation effects on the threshold voltage. All of these effects combined, the threshold voltage for the gated diode can be very precisely controlled.

Figure 24:
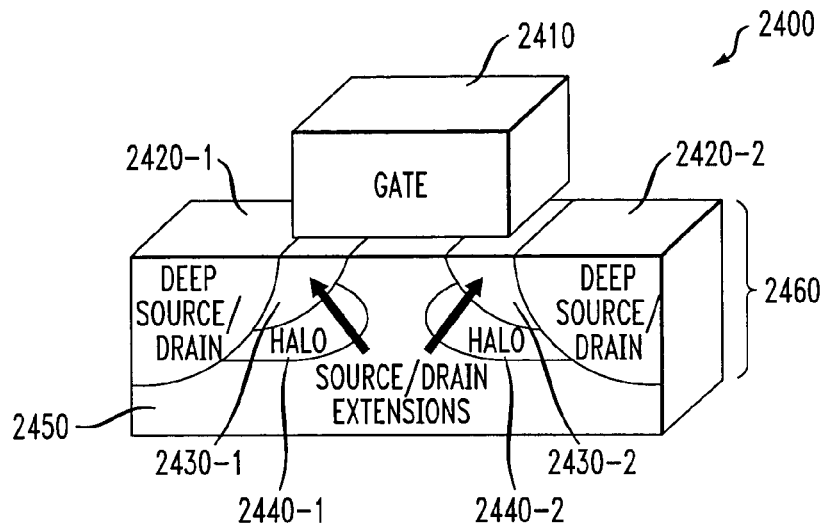
FIG. 24 is a side view of a typical Metal-Oxide-Semiconductor Field Effect Transistor (MOSFET) including source/drain extensions and halos.

In the simplest implementation of the sense amplifier circuits and sense amplifier latch circuits, the FET portion of the gated diode can be the same as that of the MOSFETs. However, depending on the fabrication process flow, this may lead to excessive parasitic capacitance. Thus, while the gated diode itself is in the low capacitance state, a non-negligible capacitance exists that may couple to the internal storage node of the sense amplifier. Much of this undesirable capacitance arises from the gate overlap of the source and drain regions of the device. In a conventional transistor, the size of this overlap region must be carefully tuned to appropriately balance parasitic resistance and capacitance. This process normally results in the use of an extension implant for the source and drain regions, which causes significant overlap capacitance to the gate electrode. For example, a typical MOSFET 2400 is shown in FIG. 24. The MOSFET 2400 comprises deep source/drain regions 2420, source/drain extensions 2430, and halos 2440. The source/drain extensions 2430 are added, as are the halos 2440, to balance parasitic resistance and capacitance.

While optimal design of the gated diode must also balance parasitics, a different design point can be used since parasitic capacitance is more important than parasitic resistance. Current drive, which is degraded by parasitic resistance, of the gated diode is only needed to charge and discharge the series combination of the gated diode oxide capacitance and any additional parasitics (e.g., anything tied to internal storage node 1801 in FIG. 18), which can be significantly smaller than the full gated diode oxide capacitance.

An improved design point that can be integrated into a standard process fabrication sequence is to simply mask out the extension and halo implants. Removal of the extension implants greatly reduces parasitic capacitance. The halo implants, which are normally used to control short-channel effects and the device threshold voltage, can also be removed from the gated diode device because it is generally large in channel length and of low threshold voltage. In addition, without the halo implant, lateral encroachment of the source and drain regions is enhanced, which can reduce the series resistance penalty introduced by removal of the extension implant.

Figure 25:
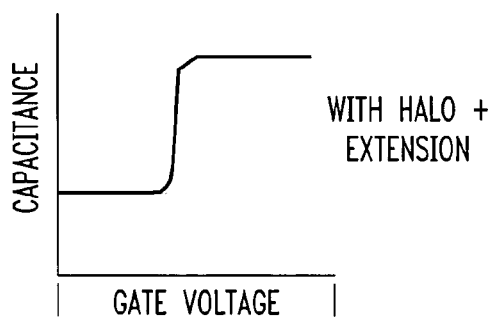
FIG. 25 is a graph of capacitance versus gate voltage for the MOSFET of FIG. 24.
Figure 26:
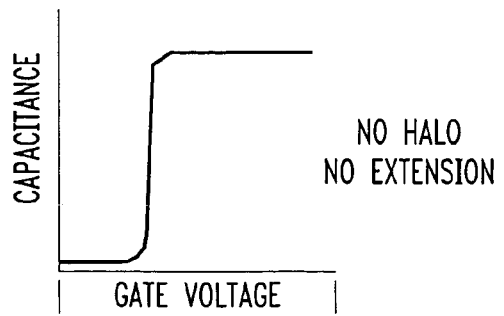
FIG. 26 is a graph of capacitance versus gate voltage for a MOSFET without source/drain extensions and halos.

FIG. 25 shows a capacitance versus gate voltage for the MOSFET of FIG. 24. As can be seen, the capacitance at low gate voltages is relatively high as compared to the capacitance (see FIG. 26) of a MOSFET formed without source/drain extensions 2430 and halos 2440. Thus, a MOSFET formed without source/drain extensions 2430 and halos 2440 can be beneficial for a gated diode in the sense amplifier circuit and sense amplifier latch circuits described above.

It is to be understood that the embodiments and variations shown and described herein are merely illustrative of the principles of this invention and that various modifications may be implemented by those skilled in the art without departing from the scope and spirit of the invention.

What is claimed is:

1. A sense amplifier circuit comprising:
   an isolation device comprising a control terminal and first and second terminals, the first terminal of the isolation device coupled to a signal line;
   a gated diode comprising first and second terminals, the first terminal of the gated diode coupled to the second terminal of the isolation device, and the second terminal of the gated diode coupled to a set line; and
   control circuitry coupled to the control terminal of the isolation device and adapted to control voltage on the control terminal of the isolation device in order to enable and disable the isolation device, the control circuitry additionally coupled to the set line and adapted to control a voltage on the set line;
   wherein the signal line is adapted to be coupled to an input signal, and wherein the second terminal of the isolation device is adapted to be used to derive an output for the sense amplifier circuit;
   wherein said gated diode has a substantially large equivalent capacitance when a threshold voltage of said gated diode is a positive voltage and when a voltage on said first terminal relative to said second terminal is greater than said threshold voltage;
   wherein said gated diode has a substantially small equivalent capacitance when said threshold voltage of said gated diode is a positive voltage and when said voltage on said first terminal relative to said second terminal is not greater than said threshold voltage;
   wherein said gated diode has a substantially large equivalent capacitance when said threshold voltage of said gated diode is a negative voltage and when a voltage on said first terminal relative to said second terminal is not greater than said threshold voltage; and
   wherein said gated diode has a substantially small equivalent capacitance when said threshold voltage of said gated diode is a negative voltage and when said voltage on said first terminal relative to said second terminal is greater than said threshold voltage.

2. The sense amplifier circuit of claim 1, wherein the gated diode comprises a Metal Oxide Semiconductor Field Effect Transistor (MOSFET), and wherein the MOSFET is formed with at least one deep source/drain region but without any source/drain extensions or halos.

3. The sense amplifier circuit of claim 1, wherein the control circuitry is adapted to place a predetermined voltage on the set line and a complement of the predetermined voltage on the control terminal of the isolation device, wherein the complement of the predetermined voltage enables the isolation device.

4. The sense amplifier circuit of claim 3, wherein the predetermined voltage is a first predetermined voltage and wherein the control circuitry is further adapted to place, after a predetermined time, a second predetermined voltage on the set line and a complement of the second predetermined voltage on the control terminal of the isolation device, wherein the complement of the second predetermined voltage disables the isolation device.

5. The sense amplifier circuit of claim 4, wherein the control circuitry is further adapted to first place the first predetermined voltage on the set line and the complement of the first predetermined voltage on the control terminal of the isolation device, thereby enabling the isolation device, then to place the second predetermined voltage on the set line and the complement of the second predetermined voltage on the control terminal of the isolation device, thereby disabling the isolation device and boosting voltage on the first terminal of the gated diode.

6. The sense amplifier circuit of claim 3, wherein placing the predetermined voltage on the set line corresponds to a set operation and placing the complement of the predetermined voltage on the control terminal of the isolation device corresponds to a sampling operation, and wherein the set operation and the sampling operation overlap or are spaced apart by a predetermined time period.

7. The sense amplifier circuit of claim 1, further comprising an output device comprising an input and an output, the input of the output device coupled to the first terminal of the gated diode and to the second terminal of the isolation device, the output of the output device adapted to be the output of the sense amplifier circuit, the output device adapted to produce an output signal on the output of the sense amplifier circuit based on a voltage on the first terminal of the gated diode.

8. The sense amplifier circuit of claim 7, wherein the output device is further adapted to holding a state of the output signal for a predetermined amount of time.

9. The sense amplifier circuit of claim 7, further comprising a latch or a keeper coupled to the output of the sense amplifier circuit and adapted to hold a state of the output signal for a predetermined amount of time on the output of the sense amplifier circuit.

10. The sense amplifier circuit of claim 7, wherein the output device comprises an inverter comprising a P-type Field Effect Transistor (PFET) and an N-type Field Effect Transistor (NFET).

11. The sense amplifier circuit of claim 10, wherein:
the PFET comprises a control terminal and first and second terminals, the control terminal of the PFET coupled to the first terminal of the gated diode, the first terminal of the PFET coupled to a power supply voltage, and the second terminal of the PFET coupled to a first terminal of the NFET; and
the NFET comprises a control terminal, the first terminal and a second terminal, the control terminal of the NFET coupled to the first terminal of the gated diode, and the second terminal of the NFET coupled to ground;
wherein the first terminal of the NFET comprises the output of the output device.

12. The sense amplifier circuit of claim 10, wherein:
the PFET comprises a control terminal and first and second terminals, the control terminal of the PFET coupled to the control circuitry, the first terminal of the PFET coupled to a power supply voltage, and the second terminal of the PFET coupled to a first terminal of the NFET; and
the NFET comprises a control terminal, the first terminal and a second terminal, the control terminal of the NFET coupled to the first terminal of the gated diode, and the second terminal of the NFET coupled to ground; wherein the first terminal of the NFET comprises the output of the output device.

13. The sense amplifier circuit of claim 12, wherein:
the isolation device is a first isolation device;
the sense amplifier circuit comprises a plurality of additional isolation devices, each of the additional isolation devices comprising a control terminal and first and second terminals, the control terminals for the additional isolation devices coupled to the control circuitry, each of the first terminals of the additional isolation devices coupled to a given one of a plurality of additional signal lines, and the second terminals for the additional isolation devices coupled to the first terminal of the gated diode.

14. The sense amplifier circuit of claim 12, wherein: the control circuitry comprises a line coupling the output of the sense amplifier circuit to the control terminal of the isolation device.

15. A semiconductor comprising at least one signal line, at least one output line, at least one set line, a sense amplifier circuit coupled to a given signal line, a given set line, and a given output line, the sense amplifier circuit comprising:
at least one gated diode amplifier comprising:
an isolation device comprising a control terminal and first and second terminals, the first terminal of the isolation device coupled to the given signal line; and
a gated diode comprising first and second terminals, the first terminal of the gated diode coupled to the second terminal of the isolation device, and the second terminal of the gated diode coupled to the given set line; and
control circuitry coupled to the control terminal of the isolation device and adapted to control voltage on the control terminal of the isolation device in order to enable and disable the isolation device, the control circuitry additionally coupled to the given set line and adapted to control a voltage on the given set line;
wherein the given signal line is adapted to be coupled to an input signal, and wherein the second terminal of the isolation device is adapted to be used to derive an output for the sense amplifier circuit;
wherein said gated diode has a substantially large equivalent capacitance when a threshold voltage of said gated diode is a positive voltage and when a voltage on said first terminal relative to said second terminal is greater than said threshold voltage;
wherein said gated diode has a substantially small equivalent capacitance when said threshold voltage of said gated diode is a positive voltage and when said voltage on said first terminal relative to said second terminal is not greater than said threshold voltage;
wherein said gated diode has a substantially large equivalent capacitance when said threshold voltage of said gated diode is a negative voltage and when a voltage on said first terminal relative to said second terminal is not greater than said threshold voltage; and
wherein said gated diode has a substantially small equivalent capacitance when said threshold voltage of said gated diode is a negative voltage and when said voltage on said first terminal relative to said second terminal is greater than said threshold voltage.

16. The semiconductor of claim 15, wherein:
the semiconductor further comprises a memory array comprising a plurality of bitlines, wordlines, wordline drivers, and memory cells, the memory cells interconnected through the bitlines and wordlines, each bitline and wordline having first and second ends, each wordline driver driving a first end of a given one of the wordlines, the at least one signal line comprising the plurality of bitlines;

the at least one gated diode amplifier comprises a plurality of gated diode amplifiers, one gated diode amplifier for each bitline, the at least one output line comprises a plurality of output lines, one output line for each bitline, each gated diode amplifier amplifying a first end of a given bitline and producing a corresponding output on an output line;

the memory array comprises a trigger memory cell at the second end of a selected wordline and the second end of a selected bitline, the trigger memory cell storing a known state; and the control circuitry comprises trigger circuitry and two inverters placed in series, the trigger circuitry placed at the first end of the selected bitline and adapted to generate, on an output, a trigger signal from a signal on the selected bitline, an output of a first inverter coupled to an input of the second inverter, an output of the second inverter coupled to the given set line, an input of the first inverter coupled to the output of the trigger circuitry.

17. The semiconductor of claim 16, wherein the control circuitry further comprises a line coupling the output of the sense amplifier circuit to the control terminal of the isolation device.

18. The semiconductor of claim 16, wherein the output of the first inverter is coupled to the control terminals of each of the isolation devices for the gated diode amplifiers.

* * * * *